US00RE50290E

(19) United States
(12) Reissued Patent
Feng et al.

(10) Patent Number: US RE50,290 E
(45) Date of Reissued Patent: Feb. 4, 2025

(54) SHIFT REGISTER, DRIVING METHOD THEREOF, GATE DRIVING CIRCUIT, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(21) Appl. No.: 17/889,180

(22) Filed: Aug. 16, 2022

Related U.S. Patent Documents

Reissue of:

(64) Patent No.: 11,302,257
Issued: Apr. 12, 2022
Appl. No.: 16/645,733
PCT Filed: Jan. 9, 2019
PCT No.: PCT/CN2019/070966
§ 371 (c)(1),
(2) Date: Mar. 9, 2020
PCT Pub. No.: WO2020/142923
PCT Pub. Date: Jul. 16, 2020

(51) Int. Cl.
*G09G 3/3266* (2016.01)
*G09G 3/3258* (2016.01)
*G11C 19/28* (2006.01)

(52) U.S. Cl.
CPC ..... *G09G 3/3266* (2013.01); *G09G 3/3258* (2013.01); *G11C 19/28* (2013.01);
(Continued)

(58) Field of Classification Search
None
See application file for complete search history.

(56) References Cited

U.S. PATENT DOCUMENTS 10,473,958 B2 * 11/2019 Iwase ..... G11C 19/28
10,783,820 B2 * 9/2020 Noh ..... G09G 3/20
(Continued)

FOREIGN PATENT DOCUMENTS

CN 107146568 A * 9/2017 ..... G11C 19/28
CN 108682397 A * 10/2018 ..... G11C 19/287
(Continued)

OTHER PUBLICATIONS

PCT International Search Report, Application No. PCT/CN2019/070966, dated Sep. 30, 2019, 6 pages: with English translation.
(Continued)

*Primary Examiner* — Yuzhen Ge
(74) *Attorney, Agent, or Firm* — Armstrong Teasdale LLP

(57) ABSTRACT

A shift register is provided, which includes a blanking input circuit, a blanking control circuit, a blanking pull-down circuit, [and] a shift register circuit, *and a twenty-ninth transistor*. The blanking input circuit may provide a blanking input signal to a first control node [according to a second clock signal.] *and comprise a first transistor* The blanking control circuit may [provide a first clock signal to a second control node and maintain a voltage difference between the first control node and the second control node, according to a voltage of the first control node.] *comprise a second transistor.* The blanking pull-down circuit may provide a voltage of the second control node to a pull-down node according to [the] *a* first clock signal *and comprise a third transistor and a third leakage-preventative transistor*. The shift register circuit may provide a shift signal via a shift signal output terminal and a first drive signal via a first drive
(Continued)

signal output terminal according to a voltage of the pull-down node.

19 Claims, 9 Drawing Sheets

(52) U.S. Cl.
CPC ... *G11C 19/287* (2013.01); *G09G 2310/0286* (2013.01); *G09G 2310/08* (2013.01)

(56) References Cited

U.S. PATENT DOCUMENTS

| | | | | |
|---|---|---|---|---|
| 10,825,539 | B2 * | 11/2020 | Feng | G09G 3/3208 |
| 10,943,553 | B2 * | 3/2021 | Zhao | G09G 3/3677 |
| 10,976,866 | B2 * | 4/2021 | Gu | G09G 3/3677 |
| 11,024,235 | B2 * | 6/2021 | Feng | G09G 3/3266 |
| 11,081,058 | B2 * | 8/2021 | Feng | G09G 3/3266 |
| 11,087,855 | B2 * | 8/2021 | Li | G09G 3/3648 |
| 11,176,871 | B2 * | 11/2021 | Feng | G09G 3/3674 |
| 11,200,825 | B2 * | 12/2021 | Feng | G09G 3/3674 |
| 11,227,550 | B2 * | 1/2022 | Feng | G09G 3/3266 |
| 11,232,763 | B2 * | 1/2022 | Yuan | G11C 19/28 |
| 11,436,961 | B2 * | 9/2022 | Feng | G09G 3/20 |
| 11,455,956 | B2 * | 9/2022 | Feng | G11C 19/28 |
| 11,568,790 | B2 * | 1/2023 | Feng | G09G 3/2092 |
| 2015/0325190 | A1 * | 11/2015 | Cao | G11C 19/28 377/64 |
| 2017/0069283 | A1 * | 3/2017 | You | G11C 19/28 |
| 2018/0090072 | A1 | 3/2018 | Sun | |
| 2018/0211606 | A1 * | 7/2018 | Zhang | G09G 3/36 |
| 2018/0337682 | A1 * | 11/2018 | Takasugi | H03K 21/18 |
| 2020/0035316 | A1 * | 1/2020 | Feng | G09G 3/3208 |
| 2020/0051507 | A1 | 2/2020 | Feng et al. | |
| 2020/0167055 | A1 * | 5/2020 | Du | G09G 3/3677 |
| 2020/0273417 | A1 * | 8/2020 | Zhao | G09G 3/3614 |
| 2021/0166633 | A1 * | 6/2021 | Feng | G09G 3/3266 |
| 2021/0193001 | A1 * | 6/2021 | Feng | G09G 3/20 |
| 2021/0201804 | A1 | 7/2021 | Feng et al. | |
| 2021/0201805 | A1 | 7/2021 | Feng et al. | |
| 2021/0375211 | A1 * | 12/2021 | Feng | G11C 19/28 |
| 2023/0041664 | A1 * | 2/2023 | Feng | G11C 19/28 |

FOREIGN PATENT DOCUMENTS

| | | | | |
|---|---|---|---|---|
| CN | 108694916 | A | * 10/2018 | G09G 3/3614 |
| CN | 108711401 | A | 10/2018 | |
| CN | 108806611 | A | 11/2018 | |
| CN | 109166527 | A | 1/2019 | |
| CN | 109166529 | A | 1/2019 | |
| JP | 2016516254 | A | 6/2016 | |
| KR | 20160068081 | A | * 6/2016 | |

OTHER PUBLICATIONS

PCT Written Opinion, Application No. PCT/CN2019/070966, dated Sep. 30, 2019, 7 pages.: with English translation of relevant part.
European Extended Search Report, Application No. 19856464.3, dated Jul. 14, 2022, 11 pps.
U.S. Non-Final Office Action, U.S. Appl. No. 16/645,733, dated Sep. 21, 2021, 13 pages.
Notice of Reasons for Refusal, Japanese Application No. 2020-558455, dated Dec. 26, 2022, 5 pages: with English translation.
Notice of Reasons for Refusal, Japanese Application No. 2023-200958, dated Aug. 23, 2024, 16 pages: with English translation.

* cited by examiner

SHIFT REGISTER, DRIVING METHOD THEREOF, GATE DRIVING CIRCUIT, AND DISPLAY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This [patent application] *application is a reissue application of U.S. Pat. No. 11,302,257 B2, which was filed as U.S. patent application Ser. No. 16/645,733 on Mar. 9, 2020 and issued on Apr. 12, 2022, and which* is a National Stage Entry of PCT/CN2019/070966 filed on Jan. 9, 2019, the [disclosure] *disclosures* of which [is] *are* incorporated by reference herein in [its] *their* entirety as part of the present application.

BACKGROUND

The present disclosure relates to the field of display technologies, and in particular, to a shift register and a driving method thereof, a gate driving circuit, an array substrate, and a display device.

With the development of display technology, compared with traditional Liquid Crystal Display (LCD) devices, the new generation of Organic Light Emitting Diode (OLED) display devices has advantages, such as, lower manufacturing costs, faster response speeds, higher contrast, wider viewing angle, larger operating temperature range, no need for a backlight unit, colorful and thin, and so on. Therefore, the OLED display technology has become the fastest growing display technology.

In order to improve process integration of an OLED display panel and reduce costs, a gate driving circuit with thin film transistors (TFTs) is usually integrated on an array substrate of the display panel by using Gate Driver on Array (GOA) technology, thereby performing scan driving for the display panel. Such gate driving circuit integrated on the array substrate using GOA technology can also be called a GOA unit or a shift register. Since the display device using the GOA circuit eliminates the need of binding a driving circuit, the cost can be reduced in terms of material costs and manufacturing processes.

BRIEF DESCRIPTION

Embodiments of the present disclosure provide a shift register and a driving method thereof, a gate driving circuit, an array substrate, and a display device.

A first aspect of the present disclosure provides a shift register. The shift register may include a blanking input circuit, a blanking control circuit, a blanking pull-down circuit, and a shift register circuit. The blanking input circuit may provide a blanking input signal from a blanking input signal terminal to a first control node according to a second clock signal from a second clock signal terminal. The blanking control circuit may provide a first clock signal from a first clock signal terminal to a second control node and maintain a voltage difference between the first control node and the second control node, according to a voltage of the first control node. The blanking pull-down circuit may provide a voltage of the second control node to a pull-down node according to the first clock signal. The shift register circuit may provide a shift signal via a shift signal output terminal and a first drive signal via a first drive signal output terminal according to a voltage of the pull-down node.

In an embodiment of the present disclosure, the blanking control circuit may include a second transistor and a first capacitor. A control electrode of the second transistor is coupled to the first control node, a first electrode of the second transistor is coupled to the first clock signal terminal, and a second electrode of the second transistor is coupled to the second control node. The first capacitor is coupled between the first control node and the second control node.

In an embodiment of the present disclosure, the blanking input circuit may include a first transistor. A control electrode of the first transistor is coupled to the second clock signal terminal, a first electrode of the first transistor is coupled to the blanking input signal terminal, and a second electrode of the first transistor is coupled to the first control node.

In an embodiment of the present disclosure, the blanking pull-down circuit may include a third transistor. A control electrode of the third transistor is coupled to the first clock signal terminal, a first electrode of the third transistor is coupled to the second control node, and a second electrode of the third transistor is coupled to the pull-down node.

In an embodiment of the present disclosure, the shift register may further include a display input circuit and an output circuit. The display input circuit may provide a first voltage from a first voltage terminal to the pull-down node according to a display input signal from a display input signal terminal. The output circuit may output the shift signal from the shift signal output terminal and output the first drive signal from the first drive signal output terminal according to the voltage of the pull-down node.

In an embodiment of the present disclosure, the display input circuit may include a fourth transistor. A control electrode of the fourth transistor is coupled to the display input signal terminal, a first electrode of the fourth transistor is coupled to the first voltage terminal, and a second electrode of the fourth transistor is coupled to the pull-down node.

In an embodiment of the present disclosure, the output circuit may include a nineteenth transistor, a twenty-second transistor, and a second capacitor. A control electrode of the nineteenth transistor is coupled to the pull-down node, a first electrode of the nineteenth transistor is coupled to a fourth clock signal terminal to receive a fourth clock signal, and a second electrode of the nineteenth transistor is coupled to the shift signal output terminal. A control electrode of the twenty-second transistor is coupled to the pull-down node, a first electrode of the twenty-second transistor is coupled to the fourth clock signal terminal to receive the fourth clock signal, and a second electrode of the twenty-second transistor is coupled to the first drive signal output terminal. The second capacitor is coupled between the pull-down node and the shift signal output terminal.

In an embodiment of the present disclosure, the shift register circuit may further include a first control circuit, a pull-up circuit, and a second control circuit. The first control circuit may control a voltage of a pull-up node according to the voltage of the pull-down node. The pull-up circuit may provide a second voltage from a second voltage terminal to the pull-down node, the shift signal output terminal, and the drive signal output terminal according to the voltage of the pull-up node. The second control circuit may control the voltage of the pull-up node according to the first clock signal and the voltage of the first control node, and control the voltage of the pull-up node according to the display input signal.

In an embodiment of the present disclosure, the pull-up node may include a first pull-up node. A control electrode and a first electrode of the seventh transistor are coupled to a third voltage terminal, and a second electrode of the seventh transistor is coupled to the first pull-up node. A control electrode of the eighth transistor is coupled to the pull-down node, a first electrode of the eighth transistor is coupled to the first pull-up node, and a second electrode of the eighth transistor is coupled to the second voltage terminal. The pull-up circuit may include a ninth transistor, a twentieth transistor, and a twenty-third transistor. A control electrode of the ninth transistor is coupled to the first pull-up node, a first electrode of the ninth transistor is coupled to the pull-down node, and a second electrode of the ninth transistor is coupled to the second voltage terminal. A control electrode of the twentieth transistor is coupled to the first pull-up node, a first electrode of the twentieth transistor is coupled to the shift signal output terminal, and a second electrode of the twentieth transistor is coupled to the second voltage terminal. A control electrode of the twenty-third transistor is coupled to the first pull-up node, a first electrode of the twenty-third transistor is coupled to the first drive signal output terminal, and a second electrode of the twenty-third transistor is coupled to the second voltage terminal. A control electrode of the thirteenth transistor is coupled to the first clock signal terminal, and a first electrode of the thirteenth transistor is coupled to the first pull-up node. A control electrode of the fourteenth transistor is coupled to the first control node, a first electrode of the fourteenth transistor is coupled to a second electrode of the thirteenth transistor, and a second electrode of the fourteenth transistor is coupled to the second voltage terminal. A control electrode of the fifteenth transistor is coupled to the display input signal terminal, a first electrode of the fifteenth transistor is coupled to the first pull-up node, and a second electrode of the fifteenth transistor is coupled to the second voltage terminal.

In an embodiment of the present disclosure, the pull-up node may further include a second pull-up node. The first control circuit further includes a tenth transistor and an eleventh transistor. A control electrode and a first electrode of the tenth transistor are coupled to a fourth voltage terminal, and a second electrode of the tenth transistor is coupled to the second pull-up node. A control electrode of the eleventh transistor is coupled to the pull-down node, a first electrode of the eleventh transistor is coupled to the second pull-up node, and a second electrode of the eleventh transistor is coupled to the second voltage terminal. The pull-up circuit may further include a twelfth transistor, a twenty-first transistor, and a twenty-fourth transistor. A control electrode of the twelfth transistor is coupled to the second pull-up node, a first electrode of the twelfth transistor is coupled to the pull-down node, and a second electrode of the twelfth transistor is coupled to the second voltage terminal. A control electrode of the twenty-first transistor is coupled to the second pull-up node, a first electrode of the twenty-first transistor is coupled to the shift signal output terminal, and a second electrode of the twenty-first transistor is coupled to the second voltage terminal. A control electrode of the twenty-fourth transistor is coupled to the second pull-up node, a first electrode of the twenty-fourth transistor is coupled to the first drive signal output terminal, and a second electrode of the twenty-fourth transistor is coupled to the second voltage terminal. The second control circuit may further include a sixteenth transistor, a seventeenth transistor, and an eighteenth transistor. A control electrode of the sixteenth transistor is coupled to a first clock signal terminal, and a first electrode of the sixteenth transistor is coupled to the second pull-up node. A control electrode of the seventeenth transistor is coupled to the first control node, a first electrode of the seventeenth transistor is coupled to a second electrode of the sixteenth transistor, and a second electrode of the seventeenth transistor is coupled to the second voltage terminal. A control electrode of the eighteenth transistor is coupled to the display input signal terminal, a first electrode of the eighteenth transistor is coupled to the second pull-up node, and a second electrode of the eighteenth transistor is coupled to the second voltage terminal.

In an embodiment of the present disclosure, the shift register circuit may further include a reset circuit. The reset circuit may reset the pull-down node according to a blanking reset signal from a blanking reset signal terminal, and reset the pull-down node according to a display reset signal from a display reset signal terminal.

In an embodiment of the present disclosure, the reset circuit may include a fifth transistor and a sixth transistor. A control electrode of the fifth transistor is coupled to the blanking reset signal terminal, a first electrode of the fifth transistor is coupled to the pull-down node, and a second electrode of the fifth transistor is coupled to the second voltage terminal. A control electrode of the sixth transistor is coupled to the display reset signal terminal, a first electrode of the sixth transistor is coupled to the pull-down node, and a second electrode of the sixth transistor is coupled to the second voltage terminal.

In an embodiment of the present disclosure, the output circuit may further include a twenty-fifth transistor and a third capacitor. A control electrode of the twenty-fifth transistor is coupled to the pull-down node, a first electrode of the twenty-fifth transistor is coupled to a fifth clock signal terminal to receive a fifth clock signal, and a second electrode of the twenty-fifth transistor. The transistor is coupled to the second drive signal output terminal. The third capacitor is coupled between the pull-down node and the second drive signal output terminal.

In an embodiment of the present disclosure, the pull-up circuit may further include a twenty-sixth transistor and a twenty-seventh transistor. A control electrode of the twenty-sixth transistor is coupled to the first pull-up node, a first electrode of the twenty-sixth transistor is coupled to the second drive signal output terminal, and a second electrode of the twenty-sixth transistor is coupled to the second voltage terminal. A control electrode of the twenty-seventh transistor is coupled to the second pull-up node, a first electrode of the twenty-seventh transistor is coupled to the second drive signal output terminal, and a second electrode of the twenty-seventh transistor is coupled to the second voltage terminal.

A second aspect of the present disclosure provides a gate driving circuit. The gate driving circuit may include N cascaded shift registers as provided in the first aspect of the present disclosure, a first sub-clock signal line, and a second sub-clock signal line. A blanking input signal terminal of the shift register at the $(i+1)^{th}$ stage is coupled to a shift signal output terminal of the shift register at the $i^{th}$ stage. A first clock signal terminal of each of the shift registers is coupled to the first sub-clock signal line. A second clock signal terminal of each of the shift registers is coupled to the second sub-clock signal line.

In an embodiment of the present disclosure, the gate driving circuit may further include a blanking reset signal line, a first sub-clock signal line, and a second sub-clock signal line. A display input signal terminal of the shift register at the $(i+2)^{th}$ stage is coupled to the shift signal output terminal of the shift register at the $i^{th}$ stage. A blanking reset signal terminal of each of the shift registers is coupled to the blanking reset signal line. A display reset signal terminal of the shift register at the $i^{th}$ stage is coupled to the shift signal output terminal of the shift register at the $(i+3)^{th}$ stage.

In an embodiment of the present disclosure, the gate driving circuit may further include a third sub-clock signal line, a fourth sub-clock signal line, a fifth sub-clock signal line, and a sixth sub-clock signal line. A fourth clock signal terminal of the shift register at the $(4i-3)^{th}$ stage is coupled to the third sub-clock signal line. A fourth clock signal terminal of the shift register at the $(4i-2)^{th}$ stage is coupled to the fourth sub-clock signal line. A fourth clock signal terminal of the shift register at the $(4i-1)^{th}$ stage is coupled to the fifth sub-clock signal line. A fourth clock signal terminal of the shift register at the $(4i)^{th}$ stage is coupled to the sixth sub-clock signal line.

In an embodiment of the present disclosure, the gate driving circuit may further include a seventh sub-clock signal line, an eighth sub-clock signal line, a ninth sub-clock signal line, and a tenth sub-clock signal line. A fifth clock signal terminal of the shift register at the $(4i-3)^{th}$ stage is coupled to the seventh sub-clock signal line. A fifth clock signal terminal of the shift register at the $(4i-2)^{th}$ stage is coupled to the eighth sub-clock signal line. A fifth clock signal terminal of the shift register at the $(4i-1)^{th}$ stage is coupled to the ninth sub clock signal line. A fifth clock signal terminal of the shift register at the $(4i)^{th}$ stage is coupled to the tenth sub-clock signal line.

A third aspect of the present disclosure provides a display device. The display device includes a gate driving circuit provided according to a second aspect of the present disclosure.

A fourth aspect of the present disclosure provides a method for driving a shift register provided by the first aspect of the present disclosure. In the method, a blanking input signal may be provided to a first control node, and a voltage difference between a first control node and a second control node may be maintained. A first clock signal may be provided to the second control node according to a voltage of the first control node, and the voltage of the first control node is controlled via the voltage difference. A voltage of the second control node may be provided to a pull-down node according to a first clock signal. A shift signal and a first drive signal may be outputted according to a voltage of the pull-down node.

BRIEF DESCRIPTION OF THE DRAWINGS

In order to illustrate the technical solutions of the present disclosure more clearly, the drawings of the embodiments will be briefly described below. It can be understood that the drawings described below are only related to some of the embodiments of the present disclosure, rather than limiting the present disclosure, wherein like reference signs indicate like elements or signals, in which.

DETAILED DESCRIPTION

Figure 1:
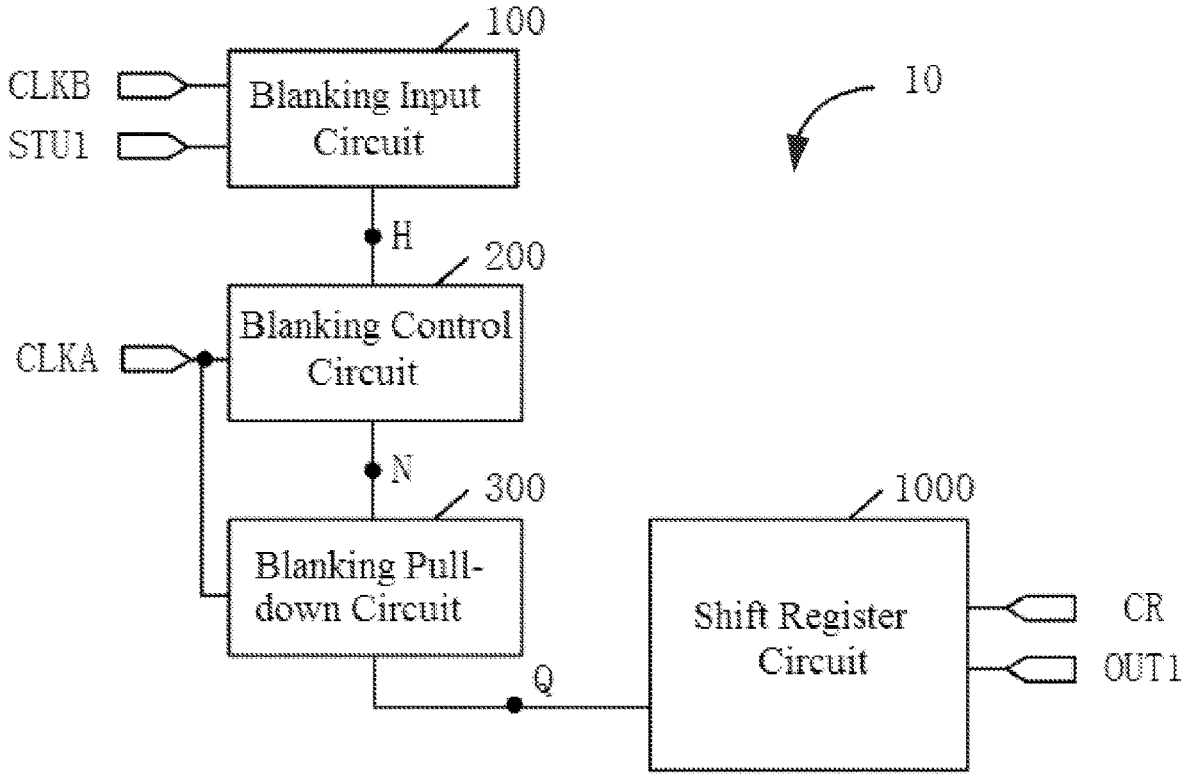
FIG. 1 shows a schematic block diagram of a shift register according to an embodiment of the present disclosure.

In order to make the technical solutions and advantages of the embodiments of the present disclosure clearer, the technical solutions of the embodiments of the present disclosure will be clearly and completely described below in conjunction with the accompanying drawings. Obviously, the described embodiments are merely part of the embodiments of the present disclosure, rather than all of the embodiments. According to the described embodiments, all the other embodiments obtained by those of ordinary skill in the art without creative labor also fall within the scope of protection of the present disclosure.

Unless otherwise stated, the technical or scientific terms used in the present disclosure shall have the ordinary meanings understood by those having ordinary skills in the art to which the present disclosure belongs. The terms "first", "second", and the like used in the present disclosure do not indicate any order, quantity, or importance, but are only used to distinguish different components. Similarly, "a", "an", or "the" and the like do not indicate a limit on quantity, but rather indicate that there is at least one. Words such as "including" or "comprising" mean that the element or item appearing before the word covers the element or item appearing after the word and the equivalent thereof, without excluding other elements or items. Words such as "connected" or "coupled" are not limited to physical or mechanical connections, but may include electrical connections, and may be direct connections or indirect connections through intermediate media. "Up", "down", "left", "right", or the like are only used to indicate the relative position relationship. In a case that the absolute position of the described object changes, the relative position relationship may also change accordingly.

In the display field, especially the organic light emitting diode OLED display technology, a gate driving circuit is usually integrated in an integrated circuit IC. The area of a chip in integrated circuit IC design is a major factor affecting chip cost. Generally, the gate driving circuit includes a detection circuit, a display circuit, and a connection circuit (or gate circuit) that outputs a composite pulse of both. This type of circuit structure is very complicated, thus it is difficult to meet the requirements of high-resolution narrow bezels.

When compensating a sub-pixel in an OLED display panel, in addition to providing a pixel compensation circuit in the sub-pixel for internal compensation, external compensation can also be performed by providing a sensing transistor. When external compensation is performed, a gate driving circuit including shift registers needs to provide a drive signal for a scanning transistor and a sensing transistor, respectively, to a sub-pixel in a display panel. For example, the display drive signal for the scanning transistor can be provided in a display period of a frame, and the sense drive signal for the sensing transistor can be provided in a blanking period of the frame.

In an embodiment of the present disclosure, "a frame", "each frame", or "a certain frame" includes a display period and a blanking period sequentially. For example, during the display period, the gate driving circuit outputs a display output signal. The display output signal can be used to drive the scanning transistors in the display panel to scan from the first line to the last line, such that the display panel may perform display. During the blanking period, the gate driving circuit outputs a blanking output signal. The blanking output signal can be used to drive the sensing transistors in a row of sub-pixels in the display panel to sense the driving current of the row of sub-pixels, such that compensation can be performed based on the sensed driving current.

Embodiments of the present disclosure provide a shift register and a driving method thereof, a gate driving circuit, and a display device. The embodiments of the present disclosure and examples thereof will be described in details below with reference to the drawings.

FIG. 1 illustrates a schematic block diagram of a shift register according to an embodiment of the present disclosure. As shown in FIG. 1, the shift register 10 may include a blanking input circuit 100, a blanking control circuit 200, a blanking pull-down circuit 300, and a shift register circuit 1000.

In the embodiment of the present disclosure, the blanking input circuit 100 may provide a blanking input signal STU1 from a blanking input signal terminal to a first control node H according to a second clock signal CLKB from a second clock signal terminal, to control a voltage of the first control at node H. For example, the blanking input circuit 100 may be coupled to the second clock signal terminal to receive the second clock signal CLKB, and coupled to the blanking input signal terminal to receive the blanking input signal STU1.

The blanking control circuit 200 may provide a first clock signal CLKA from a first clock signal terminal to a second control node N according to the voltage of the first control node H, to control the voltage of the second control node N. The blanking control circuit 200 may also maintain a voltage difference between the first control node H and the second control node N. For example, the blanking control circuit 200 may be coupled to the first clock signal terminal to receive the first clock signal CLKA.

The blanking pull-down circuit 300 may provide the voltage of the second control node N to a pull-down node Q according to the first clock signal CLKA, to control a voltage of the pull-down node Q. For example, the blanking pull-down circuit 300 may be coupled to the first clock signal terminal to receive the first clock signal CLKA.

In the embodiment, since the blanking control circuit 200 can maintain the voltage difference between the first control node H and the second control node N, when the voltage of the second control node N changes, the voltage of the first control node H correspondingly changes. Therefore, the first clock signal CLKA can be provided to the second control node N in a lossless manner. In this case, the blanking pull-down circuit 300 may provide the first clock signal CLKA (i.e., the voltage of the second control node N) to the pull-down node Q without loss. Therefore, when a low potential voltage is written to the pull-down node Q during the blanking period, the threshold voltage loss of the transistor can be eliminated.

In addition, as the blanking control circuit 200 and the blanking pull-down circuit 300 are provided between the first control node H and the pull-down node Q, it prevents the voltage of the first control node H and the second control node N from affecting the voltage of the pull-down node Q.

The shift register circuit 1000 may provide a shift signal via a shift signal output terminal and a first drive signal via a first drive signal output terminal under the control of a voltage of the pull-down node Q. In a display period of one frame, the shift signal may be configured to, for example, perform shift scanning of the shift register units from upper to lower stages. The drive signal can be configured to drive the scanning transistors in the display panel, thereby driving the display panel for display. In the blanking period of one frame, the shift signal can also be configured to performing shift scanning of the shift register units from upper to lower stages, for example. The drive signal can be configured to drive the sensing transistors in the sub-pixels in the display panel, thereby performing the external compensation for the sub-pixels in the row.

Figure 2:
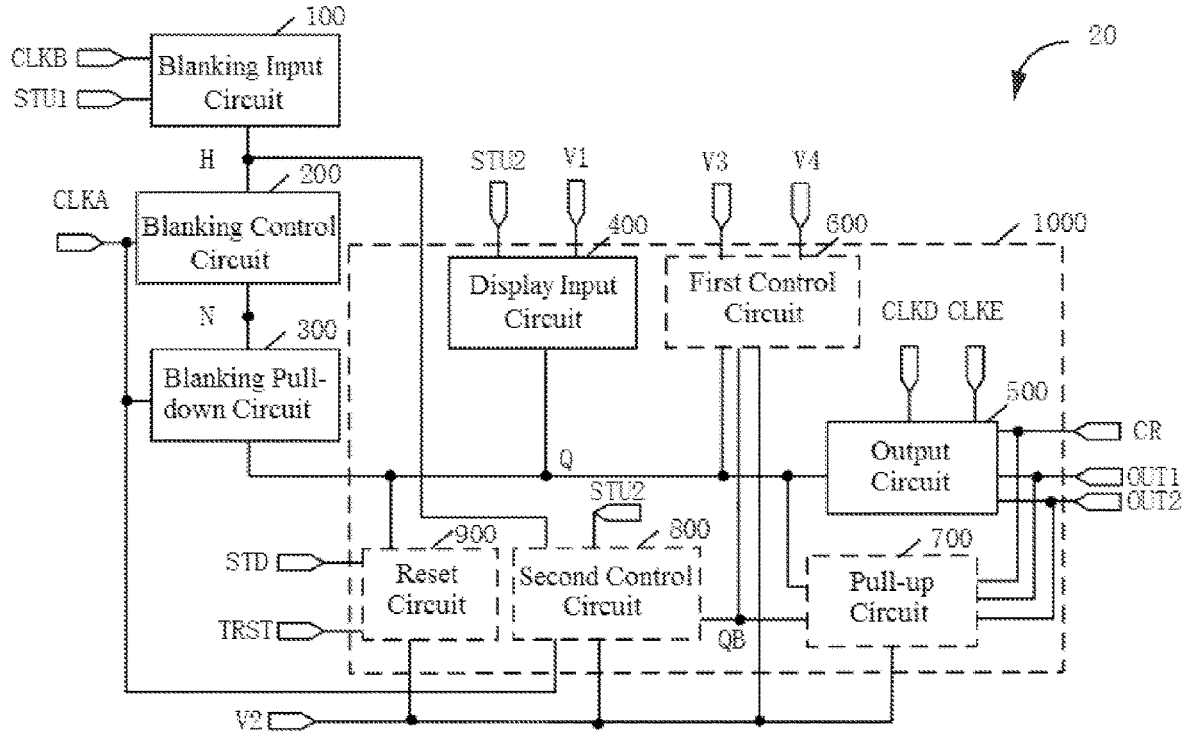
FIG. 2 shows a schematic block diagram of a shift register according to an embodiment of the present disclosure.

FIG. 2 shows a schematic block diagram of a shift register according to another embodiment of the present disclosure. As shown in FIG. 2, the shift register 20 may include a blanking input circuit 100, a blanking control circuit 200, a blanking pull-down circuit 300, and a shift register circuit 1000. In an embodiment, the shift register circuit 1000 may include a display input circuit 400 and an output circuit 500. In addition, in other embodiments, the shift register circuit 1000 may further include a first control circuit 600, a pull-up circuit 700, and a second control circuit 800. Further, in other embodiments, the shift register circuit 1000 may further include a reset circuit 900.

FIG. 2 shows an example in which the shift register circuit 1000 includes a display input circuit 400, an output circuit 500, a first control circuit 600, a pull-up circuit 700, a second control circuit 800, and a reset circuit 900. The blanking input circuit 100, the blanking control circuit 200, and the blanking pull-down circuit 300 have been described in detail above, and are not repeated here. The following mainly describes the respectively circuits in the shift register circuit 1000.

As shown in FIG. 2, the display input circuit 400 may provide a first voltage V1 from a first voltage terminal to the pull-down node Q according to a display input signal STU2 from the display input signal terminal to control a voltage of the pull-down node Q. For example, the display input circuit 400 may be coupled to the display input signal terminal to receive the display input signal STU2, and coupled to the first voltage terminal to receive the first voltage V1. In an embodiment, the first voltage terminal may provide a direct current low-level signal, that is, the first voltage V1 is at a low level.

The output circuit 500 may output a shift signal from the shift signal output terminal CR and a first drive signal from the first drive signal output terminal OUT1 according to the voltage of the pull-down node Q. For example, the output circuit 500 may be coupled to the fourth clock signal terminal to receive the fourth clock signal CLKD. The output circuit 500 may provide the fourth clock signal CLKD to the shift signal output terminal CR according to the voltage of the pull-down node Q, to output the fourth clock signal CLKD as the shift signal, and provide the fourth clock signal CLKD to the first drive signal output terminal OUT1, to output the fourth clock signal CLKD as the first drive signal.

In an embodiment, the output circuit 500 may also output a second drive signal from a second drive signal output terminal OUT2 according to the voltage of the pull-down node Q. For example, the output circuit 500 may be coupled to a fifth clock signal terminal to receive a fifth clock signal CLKE. In an embodiment, the output circuit 500 may further provide the fifth clock signal CLKE to the second drive signal output terminal OUT2 according to the voltage of the pull-down node Q, to output the fifth clock signal CLKE as the second drive signal. Those skilled in the art can understand that the number of drive signal output terminals is not limited to two, but may be more than two. The output circuit may output the respective drive signals according to the respective clock signals. In the embodiment, during the display period, the shift signal and the corresponding drive signal may also be collectively referred to as a display output signal. Moreover, during the blanking period, the shift signal and the corresponding drive signal may also be collectively referred to as a blanking output signal.

The first control circuit 600 may control the voltage of the pull-up node QB according to the voltage of the pull-down node Q. For example, the first control circuit 600 may be coupled to a second voltage terminal to receive a second voltage V2, and coupled to a third voltage terminal to receive a third voltage V3. In an embodiment, the second voltage terminal may provide a DC high-level signal, that is, the second voltage V2 is at a high level. The first control circuit 600 may control the voltage of the pull-up node QB according to the second voltage V2 and the third voltage V3, under the control of the voltage of the pull-down node Q.

Further, the first control circuit 600 may be coupled to a fourth voltage terminal to receive a fourth voltage V4. The third voltage terminal and the fourth voltage terminal may alternately provide a DC low-level signal. For example, one of the third voltage V3 and the fourth voltage V4 is at a low level, and the other is at a high level. In an embodiment, the first control circuit 600 may control the voltage of the pull-up node QB according to the second voltage V2 and the third voltage V3 (or the fourth voltage), under the control of the voltage of the pull-down node Q.

The pull-up circuit 700 may provide the second voltage V2 from the second voltage terminal to the pull-down node Q, the shift signal output terminal CR, the first drive signal output terminal OUT1 and the second drive signal output terminal OUT2 according to the voltage of the pull-up node QB. For example, the pull-up circuit 700 may be coupled to the second voltage terminal to receive the second voltage V2. Therefore, the pull-up circuit 700 pulls down the pull-down node Q, the shift signal output terminal CR, and the respective drive signal output terminal to reduce noise at each terminal.

The second control circuit 800 may control the voltage of the pull-up node QB according to the first clock signal CLKA and the voltage of the first control node H. For example, the second control circuit 800 may be coupled to the first clock signal terminal to receive the first clock signal CLKA, and coupled to the second voltage terminal to receive the second voltage. In an embodiment, the second control circuit 800 may provide the second voltage to the pull-up node QB under the control of the first clock signal CLKA and the voltage of the first control node H. In addition, the second control circuit 800 may control the voltage of the pull-up node QB according to a display input signal STU2. For example, the second control circuit 800 may be coupled to the display input signal terminal to receive the display input signal STU2. In an embodiment, the second control circuit 800 may provide the second voltage to the pull-up node QB under the control of the display input signal STU2. Therefore, the second control circuit 800 may pull up the pull-up node QB.

In addition, the reset circuit 900 may reset the pull-down node Q according to a blanking reset signal TRST from a blanking reset signal terminal, and reset the pull-down node Q according to a display reset signal STD from a display reset signal terminal. For example, the reset circuit 900 may be coupled to the blanking reset signal terminal to receive the blanking reset signal TRST, coupled to the display reset signal terminal to receive the display reset signal STD, and coupled to the second voltage terminal to receive the second voltage V2. In an embodiment, the reset circuit 900 may provide the second voltage V2 to the pull-down node Q according to the blanking reset signal TRST, and provide the second voltage V2 to the pull-down node Q according to the display reset signal STD.

Those skilled in the art can understand that, while, as FIG. 2 shows, the shift register circuit 1000 includes the display input circuit 400, the output circuit 500, the first control circuit 600, the pull-up circuit 700, the second control circuit 800, and the reset circuit 900, the above examples do not limit the protection scope of the present disclosure. In actual practice, a technician may choose to use or not use one or more of the above circuits according to the situation. Various combinations and modifications based on the foregoing circuits are not deviated from the principles of the present disclosure. The details can be omitted here.

The shift register provided by the embodiments of the present disclosure are described below with exemplary circuit structures.

Figure 3A:
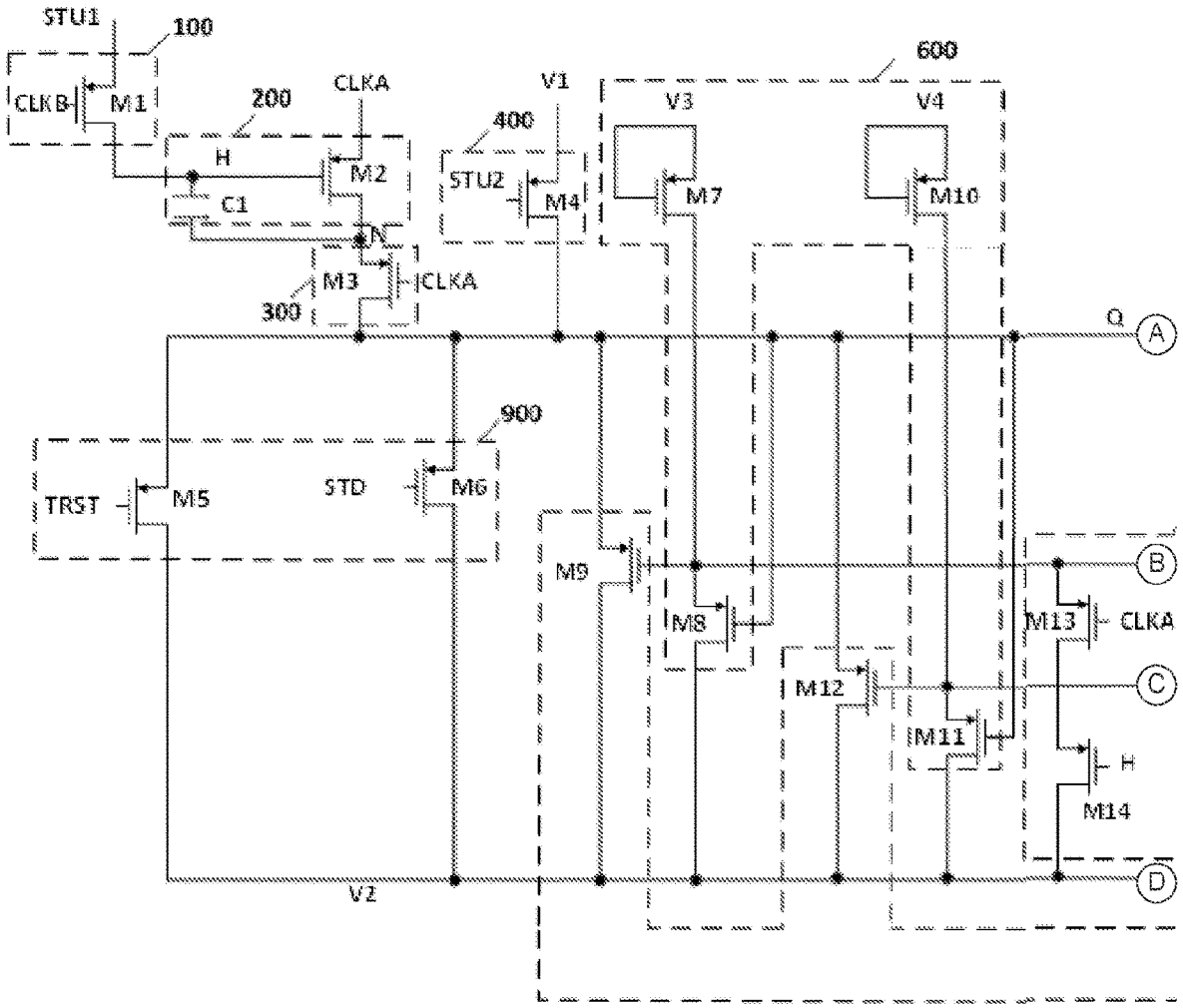
FIGS. 3A and 3B illustrate an exemplary circuit diagram of a shift register according to an embodiment of the present disclosure.
Figure 3B:
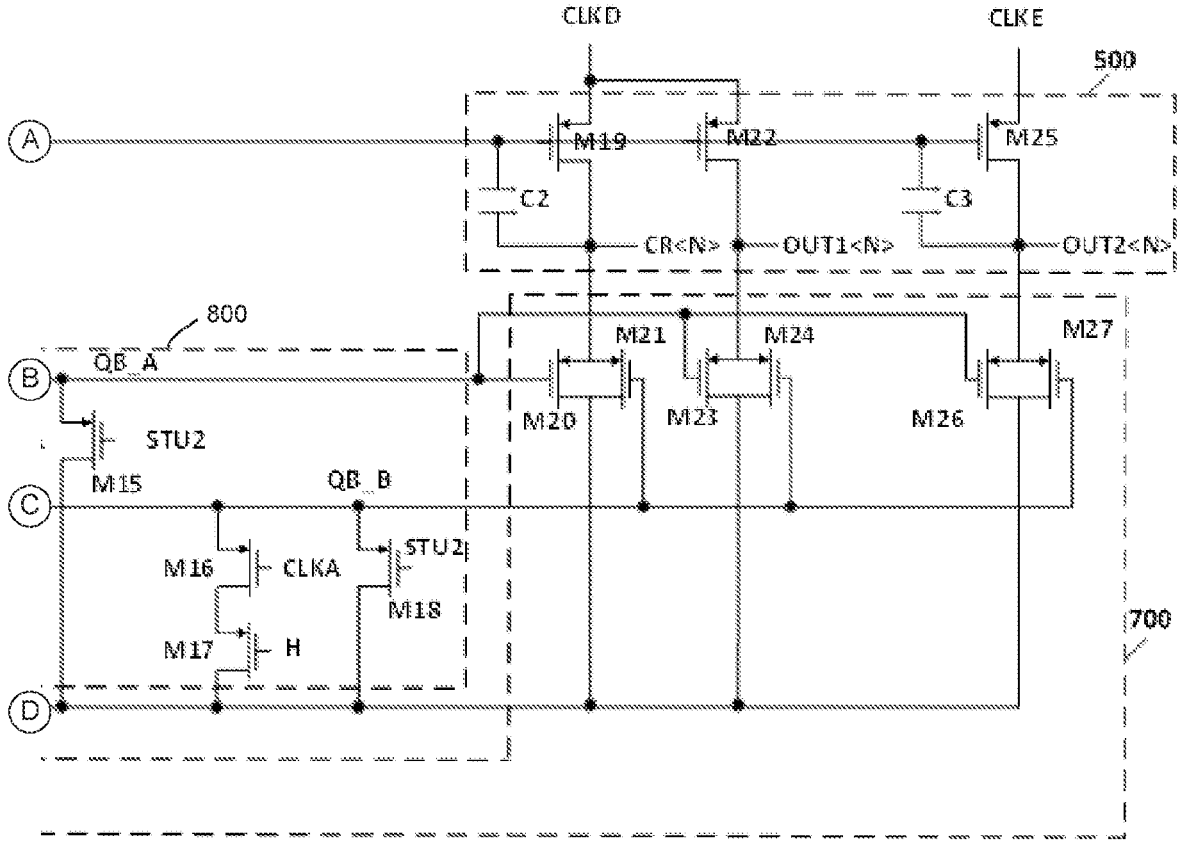

FIGS. 3A and 3B illustrate an exemplary circuit diagram of a shift register according to an embodiment of the present disclosure. The shift register is, for example, the shift register 20 shown in FIG. 2. As shown in FIGS. 3A and 3B, the shift register may include a first transistor M1 to a twenty-seventh transistor M27, and a first capacitor C1 to a third capacitor C3.

It should be noted that the transistors used in the embodiments of the present disclosure may be thin film transistors or field effect transistors or other switching devices with like characteristics. In the embodiments of the present disclosure, the thin film transistor is taken as an example for description. A source and a drain of the transistor herein can be symmetrical in structure, thus there can be no difference in structure of the source and the drain of the transistor. In an embodiment of the present disclosure, in order to distinguish the two electrodes of the transistor other than a gate, one electrode can be referred to as a first electrode and the other electrode can be referred to as a second electrode. The gate of the transistor can be referred to as a control electrode. In addition, the transistors can be classified into N-type and P-type transistors according to the characteristics of the transistors. If the transistor is a P-type transistor, an ON voltage is a low-level voltage, for example, 0V, −5V, −10V, or other suitable voltage, and an OFF voltage is a high-level voltage, for example, 5V, 10V, or other suitable voltage. If the transistor is an N-type transistor, an ON voltage is a high-level voltage, for example, 5V, 10V, or other suitable voltage, and an OFF voltage is a low-level voltage, for example, 0V, −5V, −10V, or other suitable voltage.

In addition, it should be noted that, in the embodiments of the present disclosure, the transistors in the shift register can be described by taking P-type transistors as an example. The embodiments of the present disclosure may also include, but are not limited to, for example, employing N-type transistors for at least part of the transistors in the shift register. In such cases, the potentials of the voltages, such as, the first voltage, the second voltage, or the like, may change correspondingly.

In an embodiment of the present disclosure, the pull-up node QB may include at least one of a first pull-up node QB_A and a second pull-up node QB_B. FIGS. 3A and 3B show a case where the pull-up node QB includes both the first pull-up node QB_A and the second pull-up node QB_B. It can be understood that the pull-up node QB may also include only one of the first pull-up node QB_A and the second pull-up node QB_B, and the associated circuits may only be adjusted accordingly.

As shown in FIGS. 3A and 3B, the blanking input circuit 100 includes a first transistor M1. A control electrode of the first transistor M1 is coupled to the second clock signal terminal to receive the second clock signal CLKB. A first electrode of the first transistor M1 is coupled to the blanking input signal terminal to receive the blanking input signal STU1. A second electrode of the first transistor M1 is coupled to the first control node H. In an embodiment, when the second clock signal CLKB is at a low level, the first transistor M1 is turned on, such that the blanking input signal can be provided to the first control node H to control the voltage of the first control node H.

The blanking control circuit 200 includes a second transistor M2 and a first capacitor C1. A control electrode of the second transistor M2 is coupled to the first control node H. A first electrode of the second transistor M2 is coupled to the first clock signal terminal to receive the first clock signal CLKA. A second electrode of the second transistor M2 is coupled to the second control node N. A first end of the first capacitor is coupled to the first control node H, and the second end of the first capacitor is coupled to the second control node N. In an embodiment, in a case that the voltage of the first control node H is at a low level, the second transistor M2 is turned on, and the first clock signal CLKA is provided to the second control node N to control the voltage of the second control node N. When the voltage of the second control node N changes, as the first capacitor C1 maintains the voltage difference between the first control node H and the second control node N, the voltage of the first control node H also changes accordingly.

The blanking pull-down circuit 300 includes a third transistor M3. A control electrode of the third transistor M3 is coupled to the first clock signal terminal to receive the first clock signal CLKA. A first electrode of the third transistor M3 is coupled to the second control node N. A second electrode of the third transistor M3 is coupled to the pull-down node Q. In an embodiment, in a case that the first clock signal CLKA is at a low level, the third transistor M3 is turned on, such that the voltage of the second control node N is provided to the pull-down node Q.

The display input circuit 400 includes a fourth transistor M4. A control electrode of the fourth transistor M4 is coupled to the display input signal terminal to receive the display input signal STU2. A first electrode of the fourth transistor M4 is coupled to the first voltage terminal to receive the first voltage V1. A second electrode of the fourth transistor M4 is coupled to the pull-down node Q. In an embodiment, in a case that the display input signal STU2 is at a low level, the fourth transistor M4 is turned on, to provide the first voltage V1 to the pull-down node Q, such that the voltage of the pull-down node Q is at a low level.

The output circuit 500 includes a nineteenth transistor M19, a twenty-second transistor M22, and a second capacitor C2. A control electrode of the nineteenth transistor M19 is coupled to the pull-down node Q. A first electrode of the nineteenth transistor M19 is coupled to a fourth clock signal terminal to receive a fourth clock signal CLKD. A second electrode of the nineteenth transistor M19 is coupled to the shift signal output terminal CR. A control electrode of the twenty-second transistor M22 is coupled to the pull-down node Q. A first electrode of the twenty-second transistor M22 is coupled to the fourth clock signal terminal to receive the fourth clock signal CLKD. A second electrode of the twenty-second transistor M22 is coupled to the first drive signal output terminal OUT1. A first end of the second capacitor C2 is coupled to the pull-down node Q, and the second end of the second capacitor C2 is coupled to the shift signal output terminal CR.

In addition, the output circuit 500 may further include a twenty-fifth transistor M25 and a third capacitor C3. A control electrode of the twenty-fifth transistor M25 is coupled to the pull-down node Q. A first electrode of the twenty-fifth transistor M25 is coupled to a fifth clock signal terminal to receive a fifth clock signal CLKE. A second electrode of the twenty-fifth transistor M25 is coupled to the second drive signal output terminal OUT2. A first end of the third capacitor C3 is coupled to the pull-down node Q, and a second end of the third capacitor C3 is coupled to the second drive signal output terminal OUT2.

In the embodiment, when the pull-down node Q is at a low level, the nineteenth transistor M19, the twenty-second transistor M22, and the twenty-fifth transistor M25 are turned on, to provide the fourth clock signal CLKD to the shift signal output terminal CR and the first drive signal output terminal OUT1, and to provide the fifth clock signal CLKE to the second drive signal output terminal OUT2.

The first control circuit 600 includes a seventh transistor M7, an eighth transistor M8, a tenth transistor M10, and an eleventh transistor M11. A control electrode and a first electrode of the seventh transistor M7 are coupled to a third voltage terminal to receive the third voltage V3. A second electrode of the seventh transistor M7 is coupled to the first pull-up node QB_A. A control electrode of the eighth transistor M8 is coupled to the pull-down node Q. A first electrode of the eighth transistor M8 is coupled to the first pull-up node QB_A. A second electrode of the eighth transistor M8 is coupled to the second voltage terminal to receive the second voltages V2. A control electrode and a first electrode of the tenth transistor M10 is coupled to a fourth voltage terminal V4. A second electrode of the tenth transistor M10 is coupled to the second pull-up node QB_B. A control electrode of the eleventh transistor M11 is coupled to the pull-down node Q. A first electrode of the eleventh transistor M11 is coupled to the second pull-up node QB_B. A second electrode of the eleventh transistor M11 is coupled to the second voltage terminal V2 to receive the second voltage V2.

It can be understood, in a case that the pull-up node QB includes only the first pull-up node QB_A (or the second pull-up node QB_B), the first control circuit 600 may include a seventh transistor M7 and an eighth transistor M8 (or a tenth transistor M10 and eleventh transistor M11). In this situation, the specific circuit structure is similar and will not be repeated here.

In an embodiment, the third voltage terminal V3 and the fourth voltage terminal V4 may be configured to alternately provide a low level voltage. That is, when the third voltage terminal V3 provides a high level voltage, the fourth voltage terminal V4 provides a low level voltage, and the tenth transistor M10 is turned on. When the third voltage terminal V3 provides a low level voltage, the fourth voltage terminal V4 provides a high level voltage, and the seventh transistor M7 is turned on. Therefore, only one of the seventh transistor M7 and the tenth transistor M10 is in an ON state. This can avoid performance drift caused by long-term conduction of transistor.

When the seventh transistor M7 is turned on, the first pull-up node QB_A can be charged via the third voltage V3. When the tenth transistor M10 is turned on, the second pull-up node QB_B can be charged via the fourth voltage V4. Therefore pulling the voltage of the first pull-up node QB_A or the second pull-up node QB_B can be controlled to a low level. When the voltage of the pull-down node Q is at a low level, the eighth transistor M8 and the eleventh transistor M11 are turned on. For example, in the design for the transistors, the seventh transistor M7 and the eighth transistor M8 may be configured (for example, by setting the size ratio, the threshold voltage, or the like, of the two transistors) such that when both M7 and M8 are turned on, the voltage of the first pull-up node QB_A can be pulled up to a high level, which can maintain the twentieth transistor M20, the twenty-third transistor M23, and the twenty-sixth transistor M26 in an OFF state. On the other hand, the tenth transistor M10 and the eleventh transistor M11 may be configured (for example, by setting the size ratio, the threshold voltage, or the like, of the two transistors) such that when both M10 and M11 are turned on, the voltage of the second pull-up node QB_B may be pulled up to a high level, which can maintain the twenty-first transistor M21, the twenty-fourth transistor M24, and the twenty-seventh transistor M27 in an OFF state.

As shown in FIGS. 3A and 3B, the pull-up circuit 700 includes a ninth transistor M9, a twentieth transistor M20, a twenty-third transistor M23, a twelfth transistor M12, a twenty-first transistor M21, a twenty-fourth transistor M24, a twenty-sixth transistor M26, and a twenty-seventh transistor M27.

A control electrode of the ninth transistor M9 is coupled to the first pull-up node QB_A, a first electrode of the ninth transistor M9 is coupled to the pull-down node Q, and a second electrode of the ninth transistor M9 is coupled to the second voltage terminal V2. A control electrode of the twentieth transistor M20 is coupled to the first pull-up node QB_A, a first electrode of the twentieth transistor M20 is coupled to the shift signal output terminal CR, and a second electrode of the twentieth transistor M20 is coupled to the second voltage terminal V2. A control electrode of the twenty-third transistor M23 is coupled to the first pull-up node QB_A, a first electrode of the twenty-third transistor M23 is coupled to the first drive signal output terminal OUT1, and a second electrode of the twenty-third transistor M23 is coupled to the second voltage terminal V2. A control electrode of the twenty-sixth transistor M26 is coupled to the first pull-up node QB_A, a first electrode of the twenty-sixth transistor is coupled to the second drive signal output terminal OUT2, and a second electrode of the twenty-sixth transistor is coupled to the second voltage terminals V2. In an embodiment, when the voltage of the first pull-up node QB_A is at a low level, the ninth transistor M9, the twentieth transistor M20, the twenty-third transistor M23, and the twenty-sixth transistor are turned on, such that the pull-down node Q, the shift signal output terminal CR, the first drive signal output terminal OUT1, and the second drive signal output terminal OUT2 are pulled up.

A control electrode of the twelfth transistor M12 is coupled to the second pull-up node QB_B, a first electrode of the twelfth transistor M12 is coupled to the pull-down node Q, and a second electrode of the twelfth transistor M12 is coupled to the second voltage terminal V2. A control electrode of the twenty-first transistor M21 is coupled to the second pull-up node QB_B, a first electrode of the twenty-first transistor M21 is coupled to the shift signal output terminal CR, and a second electrode of the twenty-first transistor M21 is coupled to the second voltage terminal V2. A control electrode of the twenty-fourth transistor M24 is coupled to the second pull-up node QB_B, a first electrode of the twenty-fourth transistor M24 is coupled to the first drive signal output terminal OUT1, and a second electrode of the twenty-fourth transistor M24 is coupled to the second voltage terminal V2. A control electrode of the twenty-seventh transistor M27 is coupled to the second pull-up node QB_B, a first electrode of the twenty-seventh transistor is coupled to the second drive signal output terminal OUT2, and a second electrode of the twenty-seventh transistor is coupled to the second voltage terminals V2. In an embodiment, when the voltage of the second pull-up node QB_B is at a low level, the twelfth transistor M12, the twenty-first transistor M21, the twenty-fourth transistor M24, and the twenty-seventh transistor M27 are turned on, such that the pull-down node Q, the shift signal output terminal CR, the first drive signal output terminal OUT1, and the second drive signal output terminal OUT2 are pulled up.

It can be understood that when the pull-up node QB only includes the first pull-up node QB_A (or the second pull-up node QB_B), the pull-up circuit 700 may include the ninth transistor M9, the twentieth transistor M20, the twenty-third transistor M23, and the twenty-sixth transistor (or, the twelfth transistor M12, the twenty-first transistor M21, the twenty-fourth transistor M24, and the twenty-seventh transistor M27). The specific circuit structure is the same and will not be repeated here.

As shown in FIGS. 3A and 3B, the second control circuit 800 may include a thirteenth transistor M13, a fourteenth transistor M14, a fifteenth transistor M15, a sixteenth transistor M16, a seventeenth transistor M17, and an eighteenth transistor M18.

A control electrode of the thirteenth transistor M13 is coupled to the first clock signal terminal to receive the first clock signal CLKA, and a first electrode of the thirteenth transistor M13 is coupled to the first pull-up node QB_A. A control electrode of the fourteenth transistor M14 is coupled to the first control node H, a first electrode of the fourteenth transistor M14 is coupled to a second electrode of the thirteenth transistor M13, and a second electrode of the fourteenth transistor M14 is coupled to the second voltage terminals V2. A control electrode of the fifteenth transistor M15 is coupled to the display input signal terminal to receive the display input signal STU2. A first electrode of the fifteenth transistor M15 is coupled to the first pull-up node QB_A, and a second electrode of the fifteenth transistor M15 is coupled to the second voltage terminal to receive the second voltage V2. In an embodiment, when the voltages of the first clock signal CLKA and the first control node H are both at a low level, the second voltage can be provided to the first pull-up node QB_A. In addition, when the display input signal STU2 is at a low level, the second voltage can be provided to the first pull-up node QB_A.

A control electrode of the sixteenth transistor M16 is coupled to the first clock signal terminal to receive the first clock signal CLKA, and a first electrode of the sixteenth transistor M16 is coupled to the second pull-up node QB_B. A control electrode of the seventeenth transistor M17 is coupled to the first control node H, a first electrode of the seventeenth transistor M17 is coupled to a second electrode of the sixteenth transistor M16, and a second electrode of the seventeenth transistor M17 is coupled to the second voltage terminal to receive the second voltage V2. A control electrode of the eighteenth transistor M18 is coupled to the display input signal terminal to receive the display input signal STU2. A first electrode of the eighteenth transistor M18 is coupled to the second pull-up node QB_B, and a second electrode of the eighteenth transistor M18 is coupled to the second voltage terminal to receive the second voltage V2. In an embodiment, when the voltages of the first clock signal CLKA and the first control node H are both at a low level, a second voltage can be provided to the second pull-up node QB_B. In addition, when the display input signal STU2 is at a low level, the second voltage can be provided to the second pull-up node QB_B.

It can be understood that when the pull-up node QB only includes the first pull-up node QB_A (or the second pull-up node QB_B), the pull-up circuit 700 may include the thirteenth transistor M13, the fourteenth transistor M14, and the fifteenth transistor M15 (or, the sixteenth transistor M16, the seventeenth transistor M17, and the eighteenth transistor M18). The specific circuit structure is the same and will not be repeated here.

In addition, as shown in FIGS. 3A and 3B, the reset circuit 900 may include a fifth transistor M5 and a sixth transistor M6. A control electrode of the fifth transistor M5 is coupled to the blanking reset signal terminal to receive the blanking reset signal TRST, a first electrode of the fifth transistor M5 is coupled to the pull-down node Q, and a second electrode of the fifth transistor M5 is coupled to the second voltage terminal to receive the second voltage V2. In an embodiment, when the blanking reset signal TRST is at a low level, the fifth transistor M5 is turned on, such that the second voltage V2 can be provided to the pull-down node Q. A control electrode of the sixth transistor M6 is coupled the display reset signal terminal to receive the display reset signal STD. A first electrode of the sixth transistor M6 is coupled to the pull-down node Q. A second electrode of the sixth transistor M6 is coupled to the second voltage terminal V2. In an embodiment, when the display reset signal STD is at a low level, the sixth transistor M6 is turned on, such that the second voltage V2 can be provided to the pull-down node Q.

It can be understood that the respective circuit in the shift register in the embodiment of the present disclosure is not limited to the above circuit structure. Some circuit modifications are described schematically below with reference to the accompanying drawings. The modifications are not limitative.

Figure 4A:
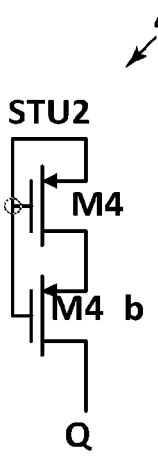
FIGS. 4A, 4B, and 4C respectively show exemplary circuit diagrams of a display input circuit according to some embodiments of the present disclosure.
Figure 4B:
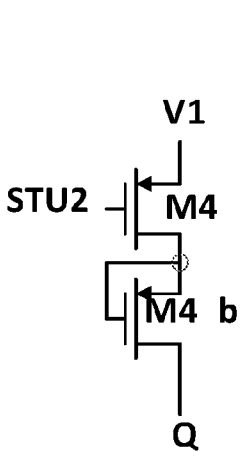
Figure 4C:
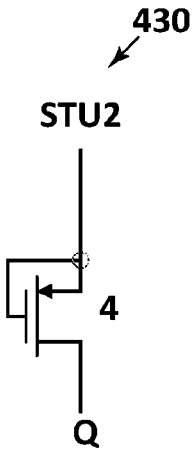

FIGS. 4A, 4B, and 4C show exemplary circuit diagrams of the display input circuit 410, the display input circuit 420, and the display input circuit 430, respectively, according to embodiments of the present disclosure.

As shown in FIG. 4A, the display input circuit 410 may include a fourth transistor M4 and a fourth leakage-preventive transistor M4_b. A control electrode and a first electrode of the fourth transistor M4 and a control electrode of the fourth leakage-preventive transistor M4_b are coupled to the display input signal terminal to receive the display input signal STU2. A second electrode of the fourth transistor M4 is coupled to a first electrode of the fourth leakage-preventive transistor M4_b. A second electrode of the fourth leakage-proof transistor M4_b is coupled to the pull-down node Q.

As shown in FIG. 4B, the display input circuit 420 may include a fourth transistor M4 and a fourth leakage-preventive transistor M4_b. A control electrode of the fourth transistor M4 is coupled to the display input signal terminal to receive the display input signal STU2. A first electrode of the fourth transistor M4 is coupled to the first voltage terminal to receive the first voltage V1. A control electrode and a first electrode of the fourth leakage preventive transistor M4_b are coupled to a second electrode of the fourth transistor M4, and a second electrode of the fourth transistor M4 is coupled to the pull-down node Q.

As shown in FIG. 4C, the display input circuit 430 may include a fourth transistor M4. A control electrode and a first electrode of the fourth transistor are coupled to the display input signal terminal to receive the display input signal STU2. A second electrode of the fourth transistor is coupled to the pull-down node Q.

Figure 5A:
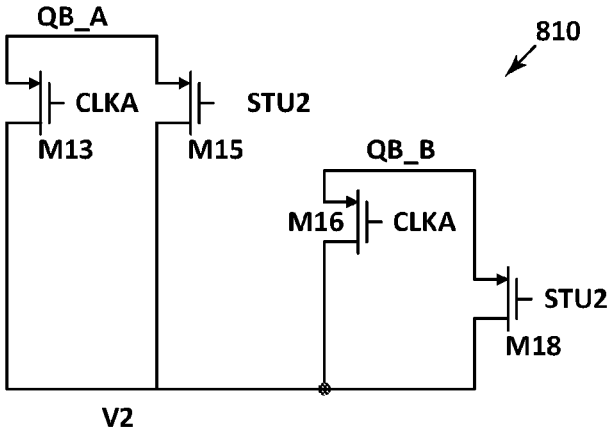
FIGS. 5A and 5B respectively show exemplary circuit diagrams of a second control circuit according to some embodiments of the present disclosure.
Figure 5B:
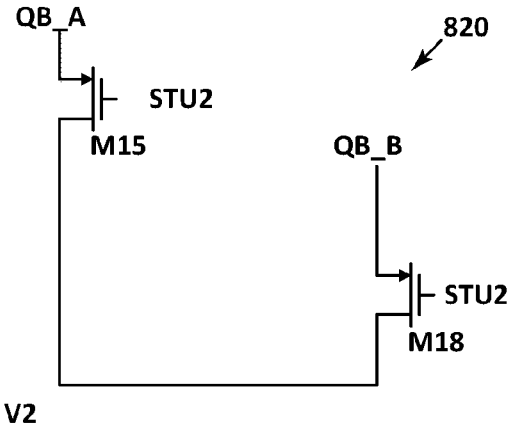

FIGS. 5A and 5B show an exemplary circuit diagram of a second control circuit 800, respectively, according to an embodiment of the present disclosure.

As shown in FIG. 5A, the second control circuit 810 includes a thirteenth transistor M13, a fifteenth transistor M15, a sixteenth transistor M16, and an eighteenth transistor M18. A control electrode of the thirteenth transistor M13 is coupled to the first clock signal terminal CLKA, a first electrode of the thirteenth transistor M13 is coupled to the first pull-up node QB_A, and a second electrode of the thirteenth transistor M13 is coupled to the second voltage terminal V2. A control electrode of the fifteenth transistor M15 is coupled to the display input signal terminal STU2, a first electrode of the fifteenth transistor M15 is coupled to the first pull-up node QB_A, and a second electrode of the fifteenth transistor M15 is coupled to the second voltage terminal V2. A control electrode of the sixteenth transistor M16 is coupled to the first clock signal terminal CLKA, a first electrode of the sixteenth transistor M16 is coupled to the second pull-up node QB_B, and a second electrode of the sixteenth transistor M16 is coupled to the second voltage terminal V2. A control electrode of the eighteenth transistor M18 is coupled to the display input signal terminal, a first electrode of the eighteenth transistor M18 is coupled to the second pull-up node QB_B, and a second electrode of the eighteenth transistor M18 is coupled to the second voltage terminal V2. Compared with the second control circuit 800 of the shift register 20 in FIGS. 3A and 3B, the second control circuit 810 does not include the fourteenth transistor M14 and the seventeenth transistor M17.

As shown in FIG. 5B, the second control circuit 820 includes a fifteenth transistor M15 and an eighteenth transistor M18. A control electrode of the fifteenth transistor M15 is coupled to the display input signal terminal STU2, a first electrode of the fifteenth transistor M15 is coupled to the first pull-up node QB_A, and a second electrode of the fifteenth transistor M15 is coupled to the second voltage terminal V2. A control electrode of the eighteenth transistor M18 is coupled to the display input signal terminal, a first electrode of the eighteenth transistor M18 is coupled to the second pull-up node QB_B, and a second electrode of the eighteenth transistor M18 is coupled to the second voltage terminal V2. Compared with the second control circuit 800 of the shift register 20 in FIGS. 3A and 3B, the second control circuit 820 does not include the thirteenth transistor M13, the fourteenth transistor M14, the sixteenth transistor M16, and the seventeenth transistor M17.

Figure 6A:
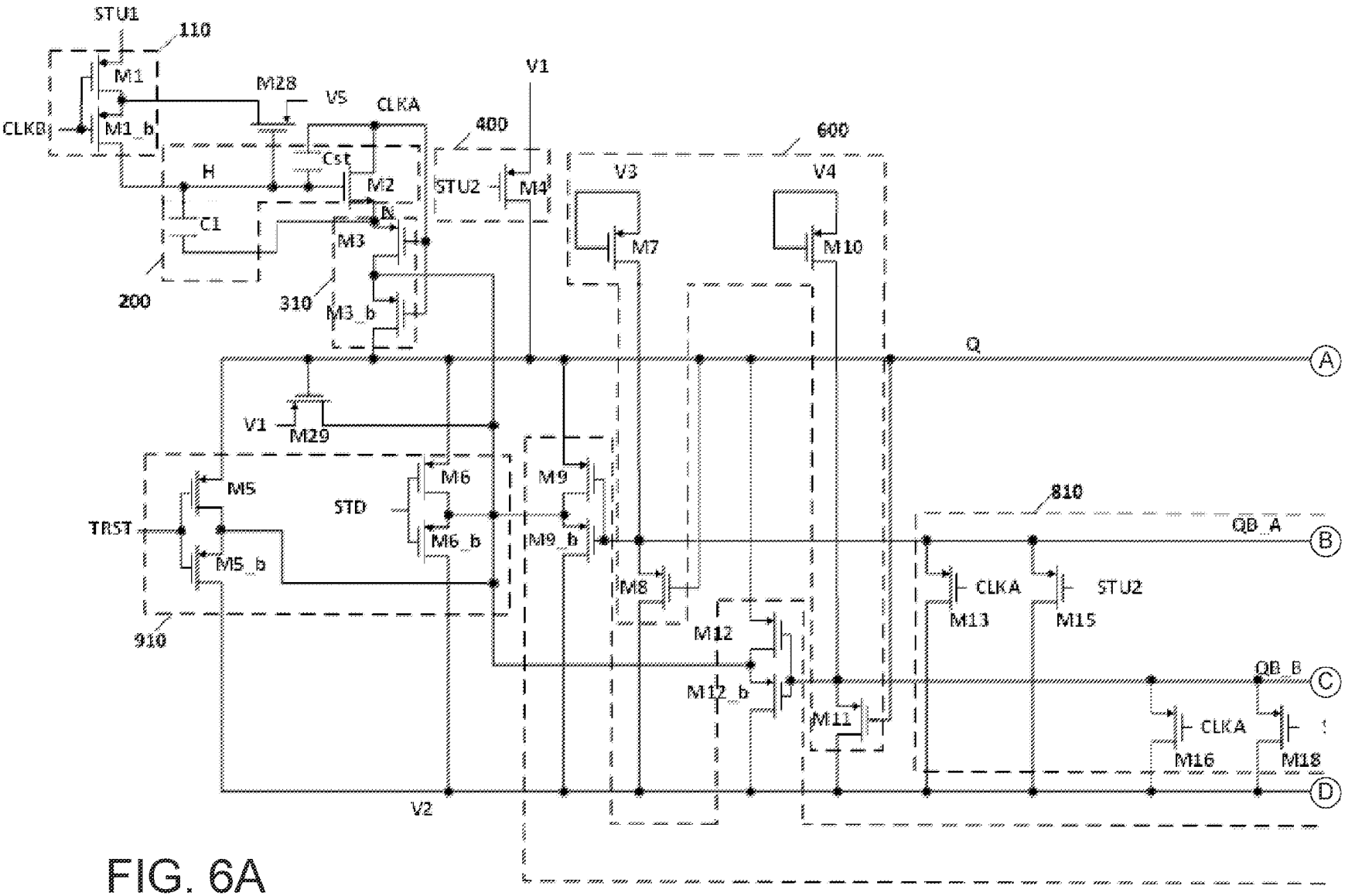
FIGS. 6A and 6B illustrate an exemplary circuit diagram of a shift register according to another embodiment of the present disclosure.
Figure 6B:
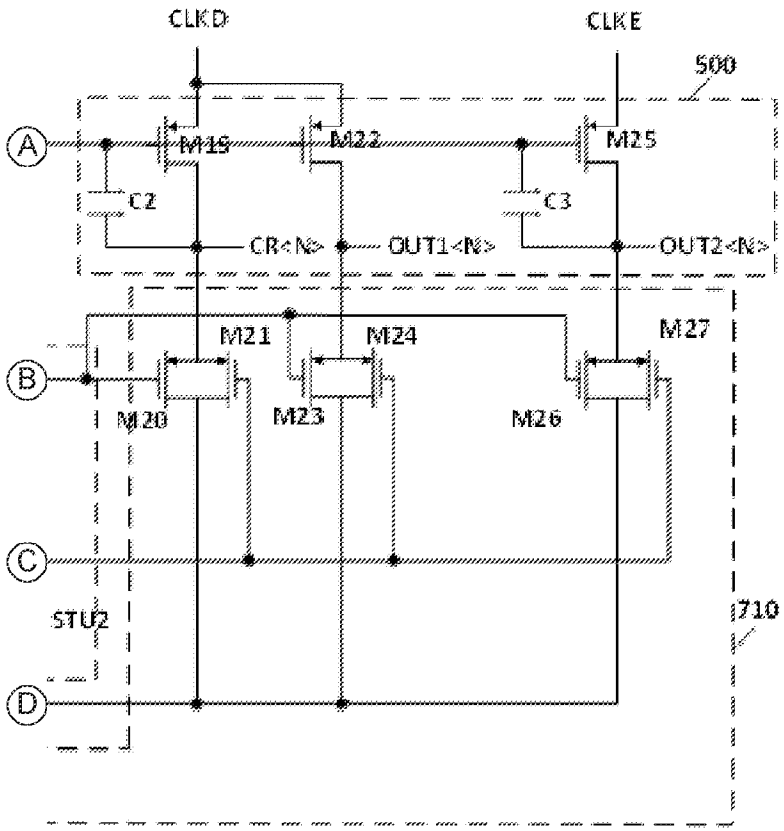

FIGS. 6A and 6B illustrate an exemplary circuit diagram of a shift register according to another embodiment of the present disclosure. The difference between the shift register shown in FIGS. 6A and 6B and the shift register in FIGS. 3A and 3B is that the second control circuit 800 is replaced with the second control circuit 810, and a first leakage-preventive transistor M1_b, a third leakage-preventive transistor M3_b, a fifth leakage-preventive transistor M5_b, a sixth leakage-preventive transistor M6_b, a ninth leakage-preventive transistor M9_b, a twelfth leakage-preventive transistor M12_b, a twenty-eighth transistor M28, and a twenty-ninth transistor M29 are added. Working principle of leakage prevention will be described below using the first leakage-preventive transistor M1_b as an example.

A control electrode of the first leakage-preventive transistor M1_b is coupled to the second clock signal terminal CLKB, a first electrode of the first leakage-preventive transistor M1_b is coupled to a second electrode of the twenty-eighth transistor M28, and a second electrode of the first leakage-preventive transistor M1_b is coupled to the first control node H. A control electrode of the twenty-eighth transistor M28 is coupled to the first control node H, and a first electrode of the twenty-eighth transistor M28 is coupled to the fifth voltage terminal V5 to receive a fifth voltage at a low level. When the first control node H is at a low level, the twenty-eighth transistor M28 is turned on under the control of the voltage of the first control node H. Therefore, a low-level signal from the fifth voltage terminal V5 can be input to the first electrode of the leakage-preventive transistor M1_b, such that both the first electrode and the second electrode of the first leakage-preventive transistor M1_b are in a low-level state, preventing the charge at the first control node H from leaking through the first leakage-preventive transistor M1_b. In this case, since the control electrode of the first leakage-preventive transistor M1_b and the control electrode of the first transistor M1 are coupled, the combination of the first transistor M1 and the first leakage-preventive transistor M1_b can achieve the same function as the first transistor M1 discussed above, while it can also preventing leakage of charge.

Similarly, the third leakage-preventive transistor M3_b, the fifth leakage-preventive transistor M5_b, the sixth leakage-preventive transistor M6_b, the ninth leakage-preventive transistor M9_b, and the twelfth leakage-preventive transistor M12_b can be combined, respectively, with the twenty-ninth transistor M29 to achieve leakage prevention structure, thereby preventing leakage of charge at the pull-down node Q. The working principle of preventing charge leakage of the pull-down node Q is the same as the above-mentioned working principle of preventing charge leakage of the first control node H. Details can be omitted herein.

*As shown in FIG. 6A, the blanking pull-down circuit 310 may include the third transistor M3 and the third leakage-preventive transistor M3_b. A control electrode of the third transistor M3 is coupled to the first clock signal terminal CLKA, a first electrode of the third transistor M3 is coupled to the second control node N, and a second electrode of the third transistor M3 is coupled to a first electrode of the third leakage-preventive transistor M3_B. A control electrode of the third leakage-preventive transistor M3_b is coupled to the first clock signal terminal CLKA, and a second electrode of the third leakage-preventive transistor M3_b is counted to the pull-down node Q.*

*A control electrode of the twenty-ninth transistor M29 is coupled to the pull-down node Q, a first electrode of the twenty-ninth transistor M29 is coupled to the first voltage terminal V1, and a second electrode of the twenty-ninth transistor M29 is coupled to the second electrode of the third transistor M3.*

Figure 7:
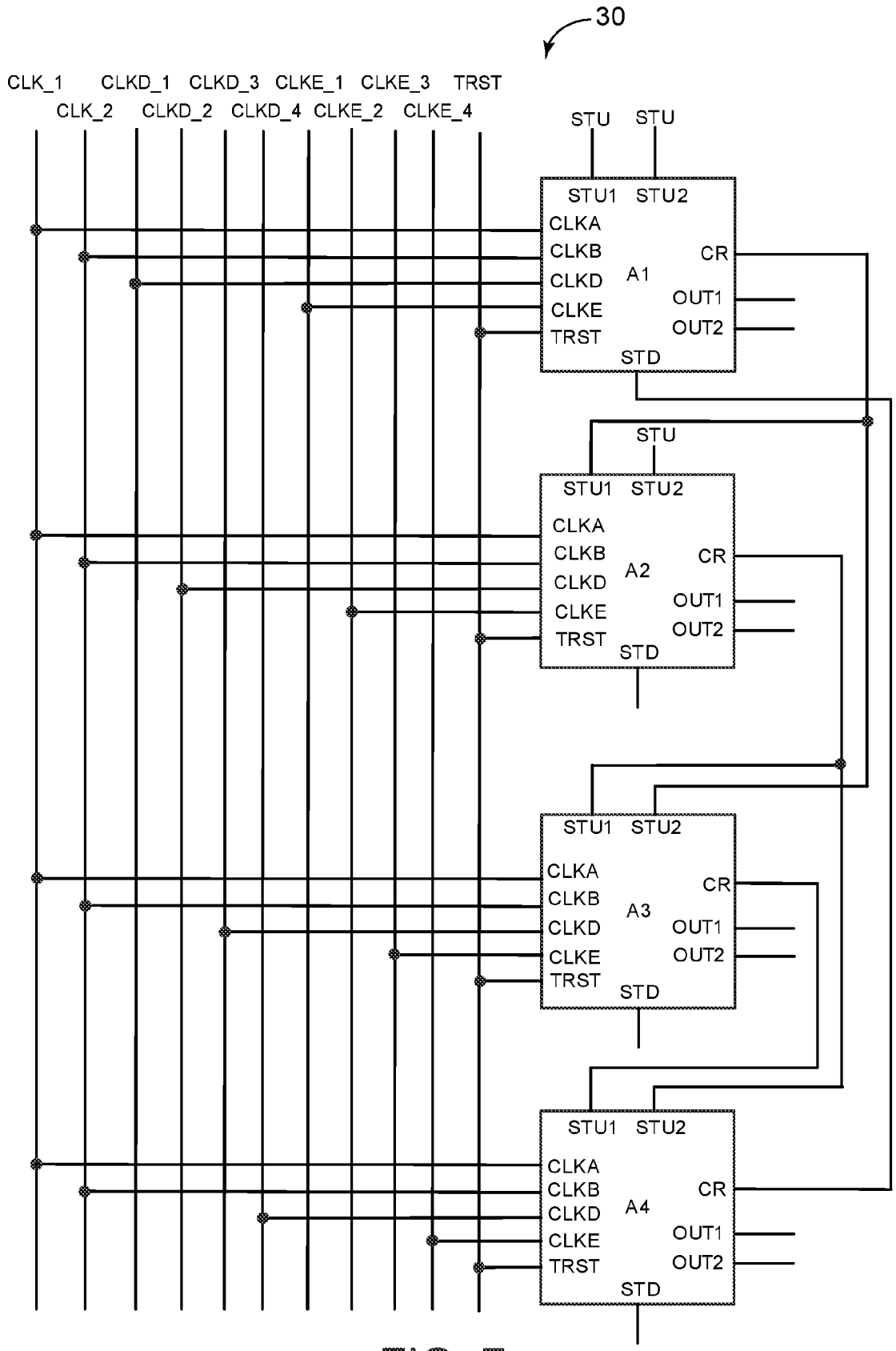
FIG. 7 illustrates a schematic diagram of a gate driving circuit according to an embodiment of the present disclosure.

Embodiments of the present disclosure also provide a gate driving circuit including a shift register. As shown in FIG. 7, the gate driving circuit 30 may include multiple (for example, N) cascaded shift registers. Any one or more of the shift registers may adopt the shift register provided by the embodiments of the present disclosure, for example, the structure of the shift register 10 or the shift register 20 or a modification thereof. It can be noted that FIG. 7 only schematically illustrates the first four stages of the shift register (A1, A2, A3, and A4) of the gate driving circuit 30.

As shown in FIG. 7, a blanking input signal terminal STU1 and a display input signal terminal STU2 of the first-stage shift register A1 and a display input signal terminal STU2 of the second-stage shift register A2 respectively receives an input signal STU. Otherwise, a blanking input signal terminal STU1 of the shift register at the $(i+1)^{th}$ stage is coupled to a shift signal output terminal CR of the shift register at the $i^{th}$ stage. A display input signal terminal STU2 of the shift register at the $(i+2)^{th}$ stage is coupled to the shift signal output terminal CR of the shift register at the $i^{th}$ stage. In addition to the shift registers at the last three stages, a display reset signal terminal STD of the shift register at the $i^{th}$ stage is connected to the shift signal output terminal CR of the shift register at the $(i+3)^{th}$ stage. Furthermore, a blanking reset signal terminal TRST of each of the shift registers is coupled to the blanking reset signal line TRST.

In an embodiment, the gate driving circuit 30 may further include a first sub-clock signal line CLK_1 and a second sub-clock signal line CLK_2. As shown in FIG. 7, a first clock signal terminal CLKA of each of the shift registers is coupled to the first sub-clock signal line CLK_1. A second clock signal terminal CLKB of each of the shift registers is coupled to the second sub-clock signal line CLK_2.

As shown in FIG. 7, the gate driving circuit 30 may further include a third sub-clock signal line CLKD_1, a fourth sub-clock signal line CLKD_2, a fifth sub-clock signal line CLKD_3, and a sixth sub-clock signal line CLKD_4. In the case where the shift register includes a fourth clock signal terminal CLKD, a fourth clock signal terminal CLKD of the shift register at the $(4i-3)^{th}$ stage is coupled to the third sub-clock signal line CLKD_1, a fourth clock signal terminal CLKD of the shift register at the $(4i-2)^{th}$ stage is coupled to the fourth sub-clock signal line CLKD_2, a fourth clock signal terminal CLKD of the shift register at the $(4i-1)^{th}$ stage is coupled to the fifth sub-clock signal line CLKD_3, and a fourth clock signal terminal CLKD of the shift register at the $(4i)^{th}$ stage is coupled to the sixth sub-clock signal line CLKD_4. For example, the third sub-clock signal line CLKD_1 provides the fourth clock signal to the first-stage shift register, the fourth sub-clock signal line CLKD_2 provides the fourth clock signal to the second-stage shift register, the fifth sub-clock signal line CLKD_3 provides the fourth clock signal to the third-stage shift register, and the sixth sub-clock signal line CLKD_4 provides the fourth clock signal to the fourth-stage shift register.

In addition, the gate driving circuit 30 may further include a seventh sub-clock signal line CLKE_1, an eighth sub-clock signal line CLKE_2, a ninth sub-clock signal line CLKE_3, and a tenth sub-clock signal line CLKE_4. In the case where the shift register includes a fifth clock signal terminal CLKE, a fifth clock signal terminal CLKE of the shift register at the $(4i-3)^{th}$ stage is coupled to the seventh sub-clock signal line CLKE_1, a fifth clock signal terminal CLKE of the shift register at the $(4i-2)^{th}$ stage is coupled to the seventh sub-clock signal line CLKE_2, a fifth clock signal terminal CLKE of the shift register at the $(4i-1)^{th}$ stage is coupled to the ninth sub clock signal line CLKE_3, and a fifth clock signal terminal CLKE of the shift register at the $(4i)^{th}$ stage is coupled to the tenth sub-clock signal line CLKE_4. For example, the seventh sub-clock signal line CLKE_1 provides the fifth clock signal to the first-stage shift register, the eighth sub-clock signal line CLKE_2 provides the fifth clock signal to the second-stage shift register, and the ninth sub-clock signal line CLKE_3 provides the fifth clock signal to the third-stage shift register provides, and the tenth sub-clock signal line CLKE_4 provides the fifth clock signal to the fourth-stage shift register.

The working process of the gate driving circuit 30 shown in FIG. 7 are described below with reference to the schematic signal timing diagram in FIG. 8. The shift register in the gate driving circuit 30 can be, for example, the shift register shown in FIGS. 3A and 3B.

Figure 8:
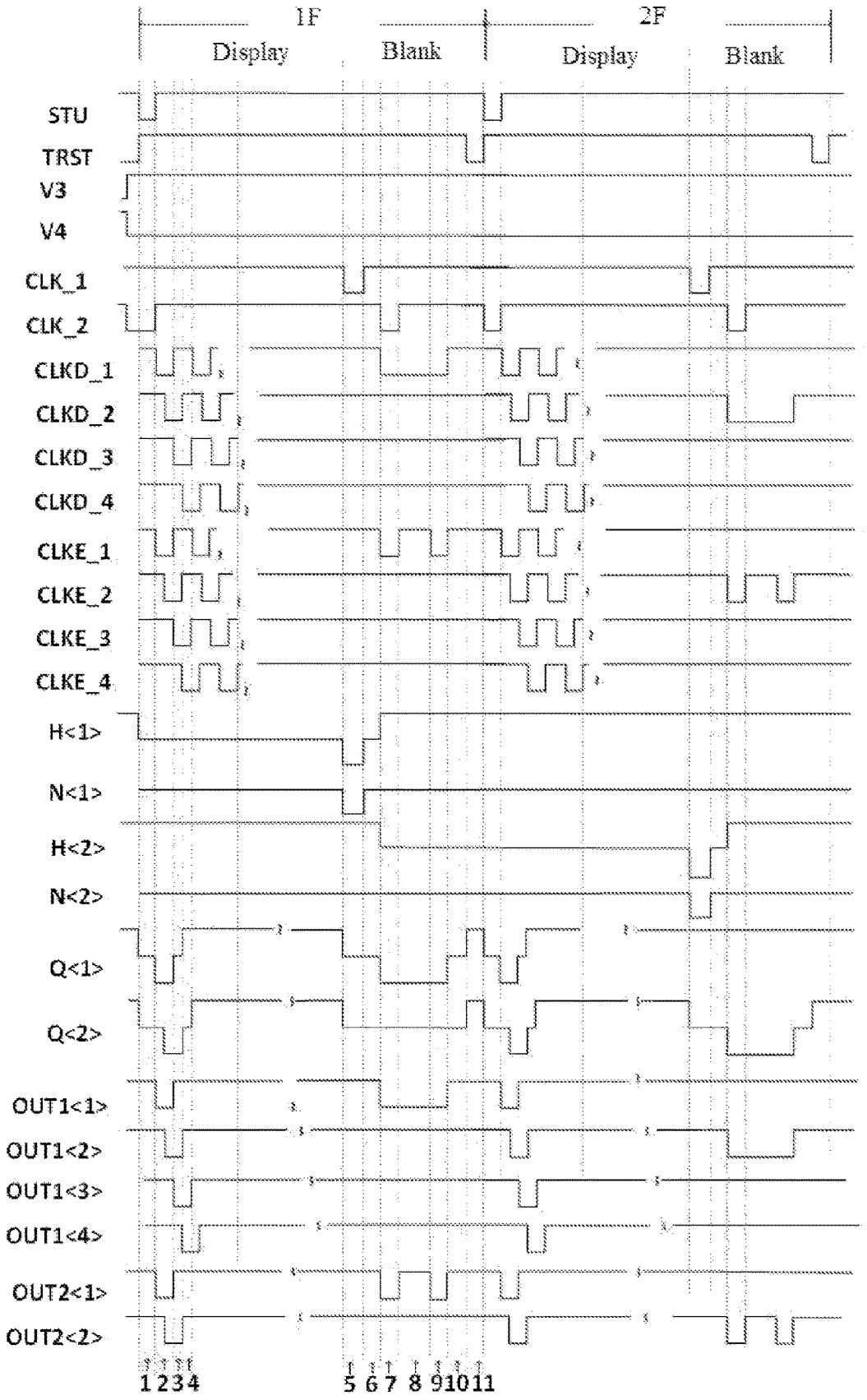
FIG. 8 shows a timing chart of signals during an operation of a gate driving circuit according to an embodiment of the present disclosure.
Figure 9:
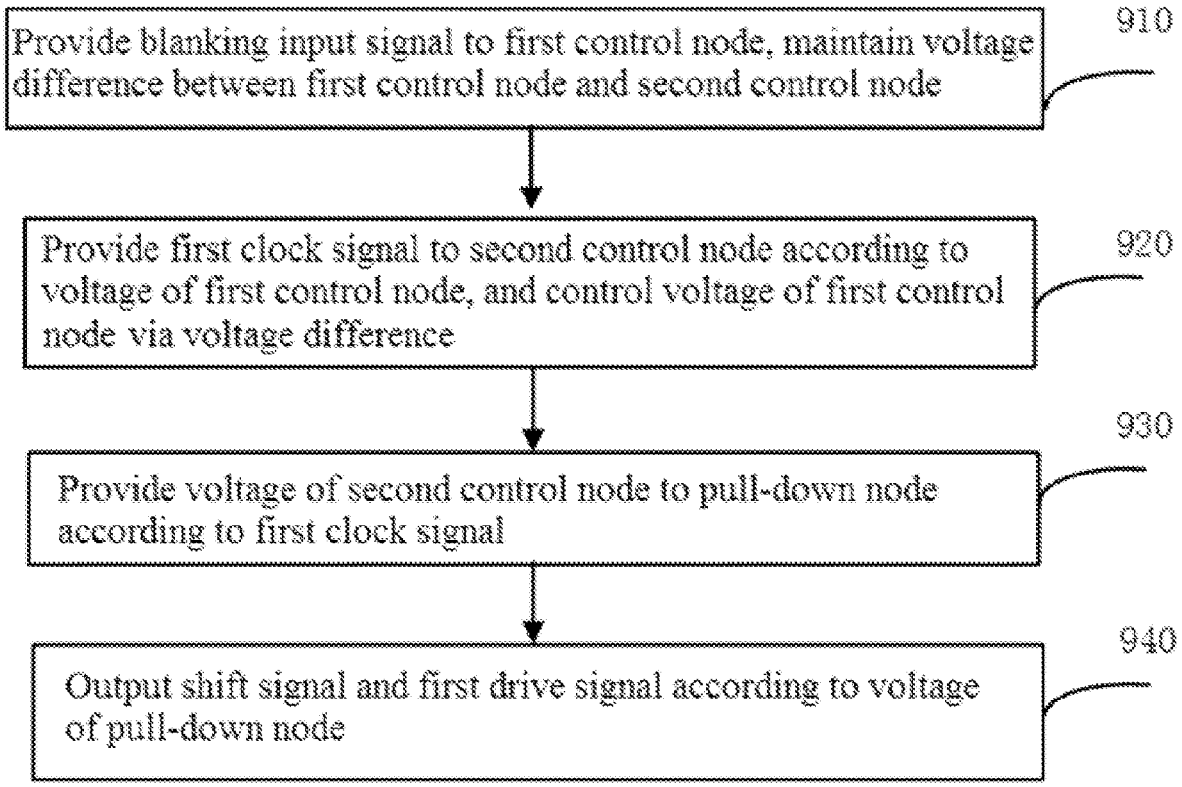
FIG. 9 shows a schematic flowchart of a method for driving a shift register according to an embodiment of the present disclosure.

FIG. 8 shows a schematic diagram for illustrating signal timing sequence for the gate driving circuit 30 shown in FIG. 7 for sequential compensation. In FIG. 9, 1F and 2F indicate the first frame and the second frame, respectively. Display indicates the display period in a frame, and Blank indicates the blanking period in a frame.

The signal STU represents the input signal STU. TRST indicates a signal provided to the blanking reset signal line TRST. The signals V3 and V4 represent signals provided to the third voltage terminal and the fourth voltage terminal of the shift register in the gate driving circuit 30, respectively. The signals CLK_1 and CLK_2 represent signals provided to the first sub-clock signal line CLK_1 and the second sub-clock signal line CLK_2, respectively. The signals CLKD_1, CLKD_2, CLKD_3, and CLKD_4 respectively represent signals provided to the third sub-clock signal line CLKD_1, the fourth sub-clock signal line CLKD_2, the fifth sub-clock signal line CLKD_3, and the sixth sub-clock signal line CLKD_4. The signals CLKE_1, CLKE_2, CLKE_3, and CLKE_4 respectively represent signals provided to the seventh sub-clock signal line CLKE_1, the eighth sub-clock signal line CLKE_2, the ninth sub-clock signal line CLKE_3, and the tenth sub-clock signal line CLKE_4.

H <1> and H <2> represent the voltages of the first control nodes H in the first-stage shift register A1 and the second-stage shift register A2 in the gate driving circuit 30, respectively. N <1> and N <2> represent the voltages of the second control nodes N in the first-stage shift register A1 and the second-stage shift register A2, respectively. Q <1> and Q <2> represent the voltages of the pull-down nodes Q in the first-stage shift register A1 and the second-stage shift register A2 in the gate driving circuit 30, respectively. OUT1 <1>, OUT1 <2>, OUT1 <3>, and OUT1 <4> represent the first drive signal output terminals OUT1 of the first-stage shift register A1, the second-stage shift register A2, the third-stage shift register A3, and the fourth-stage shift register A4 in the gate driving circuit 30, respectively. OUT2 <1> and OUT2 <2> represent the second drive signal output terminals OUT2 of the first-stage shift register A1 and the second-stage shift register A2 in the gate driving circuit 30, respectively. It can be noted that as the voltages of the shift signal output terminal CR and the drive signal output terminal OUT1 in each of the shift registers are the same, the shift signal output terminal CR is not shown in FIG. 8.

It can be noted that the voltage level of the signals in the signal timing diagram shown in FIG. 8 are only schematic and do not represent the real values of the voltage level.

The working principle of the gate driving circuit 30 shown in FIG. 7 can be described below in conjunction with the signal timing diagram in FIG. 8, in which the gate driving circuit 30 is configured for line-by-line sequential compensation. For example, the shift register in the gate driving circuit 30 in FIG. 7 may be implemented with the shift register shown in FIGS. 3A and 3B.

Before the start of the first frame 1F, the blanking reset signal line TRST and the second sub-clock signal line CLK_2 both provide a low level voltage, to provide the blanking reset signal terminal TRST and the second clock signal terminal CLKB of the shift registers at each stage. Therefore, the first transistor M1 and the fifth transistor M5 in each of the shift registers can be turned on. The blanking input signal STU1 (i.e., the input signal STU at a high level) is provided to the first control node H, such that the voltage of the first control node H is at a high level. The second voltage V2 (at a high level) is provided to the pull-down node Q, such that the voltage of the pull-down node Q is at a high level. As a result, the first control node H and the pull-down node Q at each stage are reset, implementing a global reset.

Then, the first frame 1F starts, the third voltage V3 is at a high level, and the fourth voltage V4 is at a low level. The signal provided by the blanking reset signal line TRST changes to high level, thus the fifth transistor M5 is turned off.

In the display period Display of the first frame 1F, the working process of the shift register at the first stage A1 is described as follows.

In the first period (1), the blanking input signal terminal STU1 and the display input signal terminal STU2 of the first-stage shift register are both coupled to the input signal line STU, such that the blanking input signal terminal STU1 and the display input signal terminal STU2 both provide low level signals. The second clock signal terminal CLKB provides a low-level signal, such that the first transistor M1 is turned on, thereby providing the blanking input signal STU1 to the first control node H <1>. In this case, the voltage of the first control node H <1> is at a low level, the first clock signal CLKA (coupled to the first sub-clock signal line CLK_1) is at a high level. Thus, the second transistor M2 is turned on, to provide the first clock signal CLKA to the second control node N <1>, such that the voltage of the second control node N <1> is at a high level. In addition, because the first clock signal CLKA is at a high level, the third transistor M3 is turned off, to isolate the first control node H <1> and the second control node N <1> from the pull-down node Q <1>. The first capacitor C1 maintains the voltage difference between the first control node H <1> and the second control node N <1> until the blanking period.

On the other hand, the fourth voltage V4 is at a low level. Thus the tenth transistor M10 is turned on to control the voltage of the control electrode of the twelfth transistor M12 to be a low level. Therefore, the twelfth transistor M12 is turned on, to provide the second voltage V2 to the pull-down node Q <1>, such that the voltage of the pull-down node Q <1> is at a high level. Because the display input signal STU2 is at a low level in the first period, the fourth transistor M4 is turned on, to provide the first voltage V1 to the pull-down node Q <1>, such that the voltage of the pull-down node Q <1> is at a low level. Therefore, the eighth transistor M8 and the eleventh transistor M11 are turned on, such that the first pull-up node QB_A and the second pull-up node QB_B are pulled high. Further, the pull-down node Q <1> is at a low level, such that the nineteenth transistor M19, the twenty-second transistor M22, and the twenty-fifth transistor M25 are turned on, to provide, respectively, the fourth clock signal CLKD (coupled to the third sub-clock signal line CLKD_1) and the fifth clock signal CLKE (coupled to the seventh sub-clock signal line CLKE_1) to the shift signal output terminal CR <1>, the first drive signal output terminal OUT1 <1>, and the second drive signal output terminals OUT2 <1>, thereby outputting high-level signals respectively.

Moreover, as the display input signal STU2 is at a low level, the fifteenth transistor M15 and the eighteenth transistor M18 are turned on, to provide the second voltage V2 at a high-level to the first pull-up node QB_A and the second pull-up node, respectively QB_B. Therefore, the first pull-up node QB_A and the second pull-up node QB_B can be pulled-up accordingly.

In the second period (2), a low-level signal can be provided to the fourth clock signal terminal CLKD via the third sub-clock signal line CLKD_1. A low-level signal can be provided to the fifth clock signal terminal CLKE via the seventh sub-clock signal line CLKE_1. The voltage of the pull-down node Q <1> can be further pulled down due to the bootstrap effect for the second capacitor C2. The nineteenth transistor M19, the twenty-second transistor M22, and the twenty-fifth transistor M25 are maintained in an ON state, such that the shift signal output terminal CR <1>, the first drive signal output terminal OUT1 <1>, and the second drive signal output terminal OUT2 <1> output low-level signals respectively. For example, the low-level signal from the shift signal output terminal can be configured for scanning shift of the upper to lower shift registers. Therefore, the low-level signal from the two drive signal output terminals can be configured to drive the sub-pixels in the display panel for display.

In the third period (3), the pull-down node Q <1> remains at low. Therefore, the nineteenth transistor M19, the twenty-second transistor M22, and the twenty-fifth transistor M25 remain in the ON state. A high-level signal is provided to the fourth clock signal terminal CLKD via the third sub-clock signal line CLKD_1. Moreover, a high-level signal is provided to the fifth clock signal terminal CLKE via the seventh sub-clock signal line CLKE_1. Therefore, the shift signal output terminals CR, the first drive signal output terminal OUT1, and the second drive signal output terminal OUT2 output high-level signals respectively. Because the shift signal output terminal CR <1>, the first drive signal output terminal OUT1 <1>, and the second drive signal output terminal OUT2 <1> are reset to a high level, the voltage of the pull-down node Q <1> may rise by a magnitude due to the coupling effect between the transistors. Moreover, as the display reset signal terminal STD of the first stage shift register A1 is coupled to the shift signal output terminal CR <4> (i.e., OUT1 <4>) of the fourth stage shift register A4, and the shift signal output terminal CR <4> of the fourth stage shift register A4 has not yet output a low-level signal, thus the pull-down node Q <1> may not be pulled up. Therefore, the pull-down node Q <1> can be maintained at a lower level.

In the fourth period (4), the shift signal output terminal CR <4> of the fourth-stage shift register A4 outputs a low-level signal, to provide a low-level signal to the display reset signal terminal STD of the first-stage shift register A1. In this case, the sixth transistor M6 is turned on, and the voltage of the pull-down node Q <1> becomes a high level. That is, the pull-down node Q <1> can be reset. Further, as the voltage of the pull-down node Q <1> is at a high level, the eleventh transistor M11 is turned off, and the voltage of the second pull-up node QB_B is pulled down to a low level via the tenth transistor M10. Hence, the twelfth transistor M12 is turned on, to eliminate the noise of the pull-down node Q <1>. In addition, the twenty-first transistor M21, the twenty-fourth transistor M24, and the twenty-seventh transistor M27 are turned on to provide the second voltage V2 to the shift signal output terminal CR <1>, the first drive signal output terminal OUT1 <1>, and the second drive signal output terminal OUT2 <1>, thereby outputting high-level signals, respectively.

In the display period of the first frame described above, as the first clock signal CLKA has been maintained at a low level, the third transistor M3 is turned off. The third transistor M3 can isolate the influence of the voltage at the first control node H <1> and the second control node N <1> on the pull-down node Q <1> in the display period.

After the shift register at the first stage drives the sub-pixels in the first row of the display panel to display, the shift registers at the second stage, the third stage, and the like, may drive the sub-pixels in the display panel row by row for the display drive of one frame. Then, the display period of the first frame ends.

At the beginning of the display period (Display), the first control node H <1> is written as a low level and is maintained until the blanking period (Blank). The second transistor is turned on, while the first clock signal CLKA is at a high level, therefore, the second control node N <1> is written as a high level and is maintained until the blanking period (Blank).

In the blanking period (Blank) of the first frame 1F, the working process of the shift register at the first stage A1 is described as follows.

In the fifth period (5), the first sub-clock signal line CLK_1 provides a low-level signal to the first clock signal CLKA, the first control node H <1> is maintained as low level, and the second transistor M2 is turned on. The first clock signal CLKA is provided to the second control node N <1>, such that the voltage of the second control node N <1> changes to a low level. As the first capacitor C1 maintains the voltage difference between the first control node H <1> and the second control node N <1>, the voltage of the first control node H <1> is correspondingly reduced. Therefore, the first clock signal CLKA is provided to the second control node N <1> without loss, such that the voltage of the second control node N <1> can reach the lowest potential of the first clock signal CLKA, thereby achieving lossless outputting. Moreover, the third transistor M3 is turned on, to provide the voltage of the second control node N <1> (the lossless first clock signal CLKA) to the pull-down node Q <1>, such that the voltage of the pull-down node Q <1> changes to a low level. During this period, the fourth clock signal CLKD and the fifth clock signal terminal CLKE are both high-level signals, such that the shift signal output terminal CR, the first drive signal output terminal OUT1, and the second drive signal output terminal OUT2 output high level signal, respectively.

In the sixth period (6), the first sub-clock signal line CLK_1 provides a high-level signal to the first clock signal CLKA. The voltage of the second control node N <1> changes to a high level. The voltage difference held by the first capacitor C1 causes the voltage of the first control node H <1> to rise accordingly.

In the seventh period (7), the second sub-clock signal line CLK_2 provides a low-level signal to the second clock signal CLKB. The first transistor M1 is turned on, to provide the blanking input signal STU1 at a high-level to the first control node H <1>, to pull the corresponding voltage up to a high level. The second transistor M2 is turned off, and the voltage of the second control node N <1> is held unchanged.

The third transistor M3 is turned off. The fourth clock signal CLKD and the fifth clock signal CLKE are low-level signals. The shift signal output terminal CR <1>, the first drive signal output terminal OUT1 <1>, and the second drive signal output terminal OUT2 <1> output low-level signal, respectively. With the function of the second capacitor C2 and the third capacitor C3, the voltage of the pull-down node Q <1> can be further pulled down.

Moreover, because the second clock signal CLKB is at a low level, the first transistor M1 in the shift register at the second stage A2 is turned on. The blanking input signal STU1 <2> of the shift register at the second stage A2 is coupled to the shift signal output terminal CR <1> of the shift register at the first stage A1. Therefore, the voltage of the first control node H <2> in the second-stage shift register A2 is reduced to a low level.

In the eighth period (8), the second sub-clock signal line CLK_2 provides a high-level signal to the second clock signal CLKB. The third sub-clock line CLKD_1 provides a low-level signal to the fourth clock signal terminal CLKD. The seventh sub-clock signal line CLKE_1 provides a high-level signal to the fifth clock signal terminal CLKE. In this case, the shift signal output terminal CR <1>, the first drive signal output terminal OUT1 <1> outputs a low-level signal, while the second drive signal output terminal OUT2 <1> outputs a high-level signal. The first transistor M1 in the second-stage shift register A2 is turned off. The first control node H <2> remains at a low level until the blanking period BLANK for the next frame.

In the ninth period (9), the second clock signal CLKB remains at a high level. The fourth clock signal CLKD and the fifth clock signal CLKE are both at a low level. The shift signal output terminal CR <1>, the first drive signal output terminal OUT1 <1>, and the second drive signal output terminal OUT2 <1> output low-level signal, respectively.

From the above, during the 7-9th period of the blanking period, the first drive signal output terminal OUT1 <1> outputs the first drive signal at low-level, to drive the sensing transistor (for example, P Type transistor). Therefore, the sensing transistors in the first row of sub-pixels can sense the driving current of the sub-pixels in the row, thereby compensating based on the sensed driving current.

In the tenth period (10), both the fourth clock signal CLKD and the fifth clock signal CLKE become high level. The shift signal output terminal CR <1>, the first drive signal output terminal OUT1 <1>, and the second drive signal output terminal OUT2 <1> output a high-level signal, respectively. Under the control of the second capacitor C2 and the third capacitor C3, the voltage of the pull-down node Q rises.

In the eleventh period (11), the blanking reset signal line TRST provides a low-level signal to the blanking reset signal terminal TRST. The fifth transistor M5 is turned on. The voltage of the pull-down node Q is at a high level. The fourth voltage is at a low level. The tenth transistor M10 is turned on, such that the voltage of the second pull-up node QB_B is at a low level. Accordingly, the twenty-first transistor M21, the twenty-fourth transistor M24, and the twenty-seventh transistor M27 are all turned on. Therefore, the shift signal output terminal CR <1>, the first drive signal output terminal OUT1 <1>, and the second drive signal output terminal OUT2 <1> respectively output high-level signals.

Then, a process for driving the gate driving circuit in more time periods such as a second frame 2F, a third frame 3F, or the like can be implemented with reference to the foregoing description. Details will not be described herein again.

As described above, during the blanking period of each frame, the blanking output signal from the gate driving circuit can be configured to drive the sensing transistors in the sub-pixels in the display panel. As shown in the figures, the drive signals are row-by-row sequentially provided. For example, during the blanking period of the first frame, the gate driving circuit outputs drive signals for the sub-pixels in the first row of the display panel. During the blanking period of the second frame, the gate driving circuit outputs drive signals for the sub-pixels in the second row of the display panel, and so on, thereby performing sequential compensation on a row-by-row basis.

On the other hand, an array substrate and a display device including the gate driving circuit 30 described above are also provided according to embodiments of the present disclosure. In the embodiments, the display device may include a liquid crystal panel, a liquid crystal television, a display, an OLED panel, an OLED television, an electronic paper display device, a mobile phone, a tablet, a notebook computer, a digital photo frame, a navigator, and any other product or component having a display function.

In addition, a method for driving a shift register is also provided according to embodiments of the present disclosure. FIG. 9 shows a schematic flowchart of a method for driving a shift register according to the embodiments of the present disclosure. The shift register may be any applicable shift register according to the embodiments of the present disclosure.

In a display period of a frame, in step 910, under the control of a second clock signal CLKB from a second clock signal terminal, a blanking input signal STU1 from a blanking input signal terminal is provided to a first control node H, and a voltage difference between the first control node H and a second control node N is maintained. For example, reference can be made to the description for the first period in FIG. 8.

In an embodiment, a first voltage V1 from a first voltage terminal may be provided to a pull-down node Q according to a display input signal STU2 from a display input signal terminal. For example, reference can be made to the description for the second period in FIG. 8.

Accordingly, a display output signal can be output according to a voltage of the pull-down node Q. For example, reference can be made to the description for the third period in FIG. 8.

In addition, the pull-down node Q can be reset according to a display reset signal STD. For example, reference can be made to the description for the fourth period in FIG. 8.

In a blank period of the frame, in step 920, a first clock signal CLKA from a first clock signal terminal may be provided to the second control node N according to the voltage of the first control node H. Moreover, the voltage of the first control node H may be controlled via the voltage difference held according to the voltage of the second control node N. Therefore, the first clock signal CLKA can be output to the second control node N without any loss.

In step 930, the voltage of the second control node N (that is, the lossless first clock signal CLKA) may be provided to the pull-down node Q according to the first clock signal CLKA.

For step 920 and step 930, reference can be made to, for example, the description for the fifth period in FIG. 8 above.

Then, after the first clock signal CLKA changes, the second control node N receives the first clock signal CLKA, such that the voltage of the second control node N changes. Then the voltage of the first control node H may be controlled via the maintained voltage difference according to the voltage of the second control node N. For example, reference can be made to the description for the sixth period of FIG. 8 above.

In step 940, a shift signal and a drive signal (such as a first drive signal and a second drive signal) are output according to the voltage of the pull-down node Q. Moreover, under the control of the second clock signal, the blanking input signal STU1 from the blanking input signal terminal may be provided to the first control node H, such that the first clock signal may no longer be provided to the second control node N. Reference can be made to, for example, the description for periods 7-10 of FIG. 8 above.

Then, the pull-down node Q can also be reset according to a blanking reset signal TRST. For example, reference can be made to the description for the eleventh period in FIG. 8.

Those skilled in the art can understand that while the above steps are described in order, they do not constitute a limitation on the order for the method. The embodiments of the present disclosure may also be implemented in any other suitable order. In an embodiment, the above steps may occur in different periods of the same frame, or may occur in different periods of different frames. For example, the first step may occur during the blanking period of the first frame, and other steps may occur during the display period and the blanking period of the second frame. There is no limitation for this aspect based on the present disclosure.

Several embodiments of the present disclosure have been described in detail above, but the scope of protection of the present disclosure is not limited thereto. It is apparent to those of ordinary skills in the art that various modifications, substitutions, or changes may be made to the embodiments of the present disclosure without departing from the spirit and scope of the present disclosure. The scope of protection of the present disclosure is defined by the appended claims.

What is claimed is:

1. A shift register comprising a blanking input circuit, a blanking control circuit, a blanking pull-down circuit, and a shift register circuit;

wherein the blanking input circuit is configured to provide a blanking input signal from a blanking input signal terminal to a first control [node according to a second clock signal from a second clock signal terminal;] *node, wherein the blanking input circuit comprises a first transistor; wherein a first electrode of the first transistor is coupled to the blanking input signal terminal, and wherein a second electrode of the first transistor is coupled to the first control node;* wherein the blanking control circuit [is configured to provide a first clock signal from a first clock signal terminal to a second control node and maintain a voltage difference between the first control node and the second control node, according to a voltage of the first control node] *comprises a second transistor, wherein a control electrode of the second transistor is coupled to the first control node, and wherein a second electrode of the second transistor is coupled to the second control node*;

wherein the blanking pull-down circuit is configured to provide a voltage of the second control node to a pull-down node according to [the] *a* first clock signal, *wherein the blanking pull-down circuit comprises a third transistor and a third leakage-preventive transistor; wherein a control electrode of the third transistor is coupled to a first clock signal terminal, wherein a first electrode of the third transistor is coupled to the second control node, and wherein a second electrode of the third transistor is coupled to a first electrode of the third leakage-preventive transistor; a control electrode of the third leakage-preventive transistor is coupled to the first clock signal terminal; and a second electrode of the third leakage-preventive transistor is coupled to the pull-down node*; [and]

wherein the shift register circuit is configured to provide a shift signal via a shift signal output terminal and a first drive signal via a first drive signal output terminal according to a voltage of the pull-down node*; and*

*wherein the shift register circuit further comprises a twenty-ninth transistor, wherein a control electrode of the twenty-ninth transistor is coupled to the pull-down node, a first electrode of the twenty-ninth transistor is coupled to a first voltage terminal, and a second electrode of the twenty-ninth transistor is coupled to the second electrode of the third transistor*.

2. The shift register according to claim 1, [wherein the blanking control circuit comprises a second transistor and a first capacitor;

wherein a control electrode of the second transistor is coupled to the first control node,] wherein a first electrode of the second transistor is coupled to the first clock signal terminal[, and wherein a second electrode of the second transistor is coupled to the second control node]; and

*wherein the blanking control circuit further comprises a first capacitor, and* wherein the first capacitor is coupled between the first control node and the second control node.

3. The shift register according to claim 1, [wherein the blanking input circuit comprises a first transistor;]

wherein a control electrode of the first transistor is coupled to [the] *a* second clock signal terminal[, wherein a first electrode of the first transistor is coupled to the blanking input signal terminal, and wherein a second electrode of the first transistor is coupled to the first control node].

[4. The shift register according to claim 1, wherein the blanking pull-down circuit comprises a third transistor;

wherein a control electrode of the third transistor is coupled to the first clock signal terminal, wherein a first electrode of the third transistor is coupled to the second control node, and wherein a second electrode of the third transistor is coupled to the pull-down node.]

5. The shift register according to claim 1, wherein the shift register circuit comprises [a display input circuit and] an output circuit;

[wherein the display input circuit is configured to provide a first voltage from a first voltage terminal to the pull-down node according to a display input signal from a display input signal terminal; and]

wherein the output circuit is configured to output the shift signal from the shift signal output terminal and output the first drive signal from the first drive signal output terminal according to the voltage of the pull-down node.

6. The shift register according to claim 5, *wherein the shift register circuit further comprises a display input circuit,* wherein the display input circuit comprises a fourth transistor;

wherein a control electrode *and a first electrode* of the fourth transistor [is] *are* coupled to [the] *a* display input signal terminal, [wherein a first electrode of the fourth transistor is coupled to the first voltage terminal,] and wherein a second electrode of the fourth transistor is coupled to the pull-down node.

7. The shift register according to claim 5, wherein the output circuit comprises a nineteenth transistor, a twenty-second transistor, and a second capacitor;

wherein a control electrode of the nineteenth transistor is coupled to the pull-down node, wherein a first electrode of the nineteenth transistor is coupled to a fourth clock signal terminal to receive a fourth clock signal, and wherein a second electrode of the nineteenth transistor is coupled to the shift signal output terminal;

wherein a control electrode of the twenty-second transistor is coupled to the pull-down node, [wherein a first electrode of the twenty-second transistor is coupled to the fourth clock signal terminal to receive the fourth clock signal,] and wherein a second electrode of the twenty-second transistor is coupled to the first drive signal output terminal[; and wherein the second capacitor is coupled between the pull-down node and the shift signal output terminal].

8. The shift register according to claim 5, wherein the shift register circuit further comprises a first control circuit, a pull-up circuit, and a second control circuit;

wherein the first control circuit is configured to control a voltage of a pull-up node according to the voltage of the pull-down node;

wherein the pull-up circuit is configured to provide a second voltage from a second voltage terminal to the pull-down node, the shift signal output terminal, and the drive signal output terminal according to the voltage of the pull-up node; and wherein the second control circuit is configured to control the voltage of the pull-up node according to the first clock signal and the voltage of the first control node, and control the voltage of the pull-up node according to the display input signal.

9. The shift register according to claim 8, wherein the pull-up node comprises a first pull-up node;

wherein the first control circuit comprises:

a seventh transistor, wherein a control electrode and a first electrode of the seventh transistor are coupled to a third voltage terminal, and wherein a second electrode of the seventh transistor is coupled to the first pull-up node; and an eighth transistor, wherein a control electrode of the eighth transistor is coupled to the pull-down node, wherein a first electrode of the eighth transistor is coupled to the first pull-up node, and wherein a second electrode of the eighth transistor is coupled to the second voltage terminal;

wherein the pull-up circuit comprises:

a ninth transistor, wherein a control electrode of the ninth transistor is coupled to the first pull-up node, wherein a first electrode of the ninth transistor is coupled to the pull-down node, and wherein a second electrode of the ninth transistor is coupled to the second voltage terminal;

the twentieth transistor, wherein a control electrode of the twentieth transistor is coupled to the first pull-up node, wherein a first electrode of the twentieth transistor is coupled to the shift signal output terminal, and wherein a second electrode of the twentieth transistor is coupled to the second voltage terminal; and a twenty-third transistor, wherein a control electrode of the twenty-third transistor is coupled to the first pull-up node, wherein a first electrode of the twenty-third transistor is coupled to the first drive signal output terminal, and wherein a second electrode of the twenty-third transistor is coupled to the second voltage terminal;

wherein the second control circuit comprises:

a thirteenth transistor, wherein a control electrode of the thirteenth transistor is coupled to the first clock signal terminal, and wherein a first electrode of the thirteenth transistor is coupled to the first pull-up node;

a fourteenth transistor, wherein a control electrode of the fourteenth transistor is coupled to the first control node, wherein a first electrode of the fourteenth transistor is coupled to a second electrode of the thirteenth transistor, and wherein a second electrode of the fourteenth transistor is coupled to the second voltage terminal; and a fifteenth transistor, wherein a control electrode of the fifteenth transistor is coupled to the display input signal terminal, wherein a first electrode of the fifteenth transistor is coupled to the first pull-up node, and wherein a second electrode of the fifteenth transistor is coupled to the second voltage terminal.

10. The shift register according to claim 9, wherein the pull-up node further comprises a second pull-up node;

[wherein the first control circuit further comprises:

a tenth transistor, wherein a control electrode and a first electrode of the tenth transistor are coupled to a fourth voltage terminal, and wherein a second electrode of the tenth transistor is coupled to the second pull-up node; and an eleventh transistor, wherein a control electrode of the eleventh transistor is coupled to the pull-down node, wherein a first electrode of the eleventh transistor is coupled to the second pull-up node, and wherein a second electrode of the eleventh transistor is coupled to the second voltage terminal;]

wherein the pull-up circuit further comprises:

a twelfth transistor, wherein a control electrode of the twelfth transistor is coupled to the second pull-up node, wherein a first electrode of the twelfth transistor is coupled to the pull-down node, and wherein a second electrode of the twelfth transistor is coupled to the second voltage terminal;

a twenty-first transistor, wherein a control electrode of the twenty-first transistor is coupled to the second pull-up node, wherein a first electrode of the twenty-first transistor is coupled to the shift signal output terminal, and wherein a second electrode of the twenty-first transistor is coupled to the second voltage terminal; and a twenty-fourth transistor, wherein a control electrode of the twenty-fourth transistor is coupled to the second pull-up node, wherein a first electrode of the twenty-fourth transistor is coupled to the first drive signal output terminal, and wherein a second electrode of the twenty-fourth transistor is coupled to the second voltage terminal[;

wherein the second control circuit further comprises:

a sixteenth transistor, wherein a control electrode of the sixteenth transistor is coupled to a first clock signal terminal, and wherein a first electrode of the sixteenth transistor is coupled to the second pull-up node;

a seventeenth transistor, wherein a control electrode of the seventeenth transistor is coupled to the first control node, wherein a first electrode of the seventeenth transistor is coupled to a second electrode of the sixteenth transistor, and wherein a second electrode of the seventeenth transistor is coupled to the second voltage terminal; and an eighteenth transistor, wherein a control electrode of the eighteenth transistor is coupled to the display input signal terminal, wherein a first electrode of the eighteenth transistor is coupled to the second pull-up node, and wherein a second electrode of the eighteenth transistor is coupled to the second voltage terminal].

11. The shift register according to claim 10, wherein the output circuit further comprises a twenty-fifth transistor and a third capacitor;

wherein a control electrode of the twenty-fifth transistor is coupled to the pull-down node, wherein a first electrode of the twenty-fifth transistor is coupled to a fifth clock signal terminal to receive a fifth clock signal, and wherein a second electrode of the twenty-fifth transistor is coupled to the second drive signal output terminal; and wherein the third capacitor is coupled between the pull-down node and the second drive signal output terminal.

12. The shift register according to claim 11, wherein the pull-up circuit further comprises a twenty-sixth transistor and a twenty-seventh transistor;

wherein a control electrode of the twenty-sixth transistor is coupled to the first pull-up node, wherein a first electrode of the twenty-sixth transistor is coupled to the second drive signal output terminal, and wherein a second electrode of the twenty-sixth transistor is coupled to the second voltage terminal; and wherein a control electrode of the twenty-seventh transistor is coupled to the second pull-up node, wherein a first electrode of the twenty-seventh transistor is coupled to the second drive signal output terminal, and wherein a second electrode of the twenty-seventh transistor is coupled to the second voltage terminal.

13. The shift register according to claim 8, wherein the shift register circuit further comprises a reset circuit;

wherein the reset circuit is configured to reset the pull-down node according to a blanking reset signal from a blanking reset signal terminal, and reset the pull-down node according to a display reset signal from a display reset signal terminal.

14. The shift register according to claim 13, wherein the reset circuit comprises a fifth transistor and a sixth transistor;

wherein a control electrode of the fifth transistor is coupled to the blanking reset signal terminal, wherein a first electrode of the fifth transistor is coupled to the pull-down node, and wherein a second electrode of the fifth transistor is coupled to the second voltage terminal; and wherein a control electrode of the sixth transistor is coupled to the display reset signal terminal, wherein a first electrode of the sixth transistor is coupled to the pull-down node, and wherein a second electrode of the sixth transistor is coupled to the second voltage terminal.

15. A gate driving circuit comprising N [cascaded] shift registers [according to claim 1, a first sub-clock signal line, and a second sub-clock signal line;] *cascaded together, wherein the shift register of the N shift registers comprises a blanking input circuit, a blanking control circuit, a blanking pull-down circuit, and a shift register circuit;*

[wherein a blanking input signal terminal of the shift register at the $(i+1)^{th}$ stage is coupled to a shift signal output terminal of the shift register at the $i^{th}$ stage;

wherein a first clock signal terminal of each of the shift registers is coupled to the first sub-clock signal line; and wherein a second clock signal terminal of each of the shift registers is coupled to the second sub-clock signal line]

*wherein the blanking input circuit is configured to provide a blanking input signal from a blanking input signal terminal to a first control node, wherein the blanking input circuit comprises a first transistor; wherein a first electrode of the first transistor is coupled to the blanking input signal terminal, and wherein a second electrode of the first transistor is coupled to the first control node;*

*wherein the blanking control circuit comprises a second transistor, wherein a control electrode of the second transistor is coupled to the first control node, and wherein a second electrode of the second transistor is coupled to the second control node;*

*wherein the blanking pull-down circuit is configured to provide a voltage of the second control node to a pull-down node according to a first clock signal, wherein the blanking pull-down circuit comprises a third transistor and a third leakage-preventive transistor; wherein a control electrode of the third transistor is coupled to the first clock signal terminal, wherein a first electrode of the third transistor is coupled to the second control node, and wherein a second electrode of the third transistor is coupled to a first electrode of the third leakage-preventive transistor; a control electrode of the third leakage-preventive transistor is coupled to the first clock signal terminal; and a second electrode of the third leakage-preventive transistor is coupled to the pull-down node; and*

*wherein the shift register circuit is configured to provide a shift signal via a shift signal output terminal and a first drive signal via a first drive signal output terminal according to a voltage of the pull-down node;*

*wherein the shift register circuit further comprises a twenty-ninth transistor, wherein a control electrode of the twenty-ninth transistor is coupled to the pull-down node, a first electrode of the twenty-ninth transistor is coupled to a first voltage terminal, and a second electrode of the twenty-ninth transistor is coupled to the second electrode of the third transistor.*

16. The gate driving circuit according to claim 15, further comprising a blanking reset signal line[, a first sub-clock signal line, and a second sub-clock signal line;

wherein a display input signal terminal of the shift register at the $(i+2)^{th}$ stage is coupled to the shift signal output terminal of the shift register at the $i^{th}$ stage];

wherein a blanking reset signal terminal of each of the shift registers is coupled to the blanking reset signal line; and wherein a display reset signal terminal of the shift register at the $i^{th}$ stage is coupled to the shift signal output terminal of the shift register at the $(i+3)^{th}$ stage.

17. The gate driving circuit according to claim 15, further comprising a third sub-clock signal line, a fourth sub-clock signal line, a fifth sub-clock signal line, and a sixth sub-clock signal line;

wherein a fourth clock signal terminal of the shift register at the $(4i-3)^{th}$ stage is coupled to the third sub-clock signal line;

wherein a fourth clock signal terminal of the shift register at the $(4i-2)^{th}$ stage is coupled to the fourth sub-clock signal line;

wherein a fourth clock signal terminal of the shift register at the $(4i-1)^{th}$ stage is coupled to the fifth sub-clock signal line; and wherein a fourth clock signal terminal of the shift register at the $(4i)^{th}$ stage is coupled to the sixth sub-clock signal line.

18. The gate driving circuit according to claim 15, further comprising a seventh sub-clock signal line, an eighth sub-clock signal line, a ninth sub-clock signal line, and a tenth sub-clock signal line;

wherein a fifth clock signal terminal of the shift register at the $(4i-3)^{th}$ stage is coupled to the seventh sub-clock signal line;

wherein a fifth clock signal terminal of the shift register at the $(4i-2)^{th}$ stage is coupled to the eighth sub-clock signal line;

wherein a fifth clock signal terminal of the shift register at the $(4i-1)^{th}$ stage is coupled to the ninth sub clock signal line; and wherein a fifth clock signal terminal of the shift register at the $(4i)^{th}$ stage is coupled to the tenth sub-clock signal line.

19. A display device comprising a gate driving circuit according to claim 15.

20. A method for driving [the] *a* shift register [according to claim 1, comprising:],

*wherein the shift register comprises a blanking input circuit, a blanking control circuit, a blanking pull-down circuit, and a shift register circuit;*

*wherein the blanking input circuit is configured to provide a blanking input signal from a blanking input signal terminal to a first control node, wherein the blanking input circuit comprises a first transistor; wherein a first electrode of the first transistor is coupled to the blanking input signal terminal, and wherein a second electrode of the first transistor is coupled to the first control node;*

*wherein the blanking control circuit comprises a second transistor, wherein a control electrode of the second transistor is coupled to the first control node, and wherein a second electrode of the second transistor is coupled to the second control node;*

*wherein the blanking pull-down circuit is configured to provide a voltage of the second control node to a pull-down node according to a first clock signal, wherein the blanking pull-down circuit comprises a third transistor and a third leakage-preventive transistor; wherein a control electrode of the third transistor is coupled to the first clock signal terminal, wherein a first electrode of the third transistor is coupled to the second control node, and wherein a second electrode of the third transistor is coupled to a first electrode of the third leakage-preventive transistor; a control electrode of the third leakage-preventive transistor is coupled to the first clock signal terminal; and a second electrode of the third leakage-preventive transistor is coupled to the pull-down node; and*

*wherein the shift register circuit is configured to provide a shift signal via a shift signal output terminal and a first drive signal via a first drive signal output terminal according to a voltage of the pull-down node;*

*wherein the shift register circuit further comprises a twenty-ninth transistor, wherein a control electrode of the twenty-ninth transistor is coupled to the pull-down node, a first electrode of the twenty-ninth transistor is coupled to a first voltage terminal, and a second electrode of the twenty-ninth transistor is coupled to the second electrode of the third transistor;*

*the method comprising:* providing the blanking input signal to the first control node and maintaining the voltage difference between the first control node and the second control node;

providing the first clock signal to the second control node according to the voltage of the first control node, and controlling the voltage of the first control node via the voltage difference;

providing the voltage of the second control node to the pull-down node according to the first clock signal; and outputting the shift signal and the first drive signal according to the voltage of the pull-down node.

* * * * *